(12) United States Patent
Hershey et al.

(10) Patent No.: US 8,627,246 B2
(45) Date of Patent: Jan. 7, 2014

(54) IMPLEMENTATION OF FACTOR GRAPHS

(75) Inventors: Shawn Hershey, Jamaica Plain, MA (US); Benjamin Vigoda, Winchester, MA (US)

(73) Assignee: Analog Devices, Inc., Norwood, MA (US)

( * ) Notice: Subject to any disclaimer, the term of this patent is extended or adjusted under 35 U.S.C. 154(b) by 258 days.

(21) Appl. No.: 13/006,060

(22) Filed: Jan. 13, 2011

(65) Prior Publication Data

US 2012/0159408 A1 Jun. 21, 2012

Related U.S. Application Data

(60) Provisional application No. 61/306,842, filed on Feb. 22, 2010, provisional application No. 61/294,740, filed on Jan. 13, 2010.

(51) Int. Cl.
*G06F 17/50* (2006.01)
(52) U.S. Cl.
USPC ........... 716/100; 716/104; 716/106; 716/110; 716/111
(58) Field of Classification Search
USPC ................................. 716/100–104, 110–113
See application file for complete search history.

(56) References Cited

U.S. PATENT DOCUMENTS

| | | | |
|---|---|---|---|
| 4,649,515 A | 3/1987 | Thompson | |
| 5,243,688 A | 9/1993 | Pechanek | |
| 5,745,382 A | 4/1998 | Vilim | |
| 5,959,871 A | 9/1999 | Pierzchala | |
| 6,185,331 B1 | 2/2001 | Shi | |
| 6,763,340 B1 | 7/2004 | Burns | |
| 6,771,197 B1 | 8/2004 | Yedidia | |
| 7,769,798 B2 | 8/2010 | Banihashemi | |
| 7,814,402 B2 | 10/2010 | Gaudet | |
| 2004/0030414 A1 | 2/2004 | Koza | |
| 2005/0240647 A1 | 10/2005 | Banihashemi | |
| 2007/0276270 A1 | 11/2007 | Tran | |
| 2008/0033897 A1 | 2/2008 | Lloyd | |
| 2009/0100313 A1 | 4/2009 | Gross | |
| 2009/0144218 A1 | 6/2009 | Bonawitz | |
| 2009/0217232 A1* | 8/2009 | Beerel et al. ..................... 716/18 |
| 2009/0307639 A1 | 12/2009 | Chapman et al. | |

(Continued)

FOREIGN PATENT DOCUMENTS

| WO | WO2010/101933 | 9/2010 |
|---|---|---|
| WO | WO2010/101944 | 9/2010 |
| WO | WO2010/259256 | 3/2011 |

OTHER PUBLICATIONS

Kschischang, Factor Graphs and the Sum-Product Algorithm, IEEE Trans. Info. Theory, 47(2), 2001.

(Continued)

*Primary Examiner* — Paul Dinh
(74) *Attorney, Agent, or Firm* — Occhiuti & Rohlicek LLP

(57) ABSTRACT

The process of implementing a belief propagation network in software and/or hardware can begin with a factor-graph-designer who designs a factor graph that implements that network. A development system provides a user with a way to specify a factor graph at a high or abstract level, and then solve the factor graph, or make an instance of the factor graph in software and/or hardware based on the specification. Factor graphs enable designers to create a graphical model of complicated belief propagation networks such as Markov chains, hidden Markov models, and Bayesian networks.

22 Claims, 15 Drawing Sheets

(56) References Cited

U.S. PATENT DOCUMENTS

2009/0313596 A1  12/2009  Lippmann et al.
2010/0223225 A1   9/2010  Vigoda
2011/0072406 A1*  3/2011  Chaudhry et al. ............ 716/120

OTHER PUBLICATIONS

LeCun, Loss Functions for Discriminative Training of Energy Based Models, in Proc. of the 10-th International Workshop on Artificial Intelligence and Statistics, 2005.

Loeliger, Some Remarks on Factor Graphs, Brest 2003.

Loeliger, An Introduction to Factor Graphs, IEEE Signal Processing Magazine, pp. 28-41, Jan. 2004.

Luckenbill, Building Bayesian Networks with Analog Subthreshold CMOS Circuits, Yale University, 2002.

Mansinghka, Stochastic Digital Circuits for Probabilistic Inference, MIT, Cambridge, Nov. 2008.

Mansinghka, Natively Probabilistic Computation, MIT Ph.D. 2009.

Rapley, Stochastic Iterative Decoding on Factor Graphs, Proc. 3rd Int. Symp. on Turbo Codes and Related Topics, pp. 507-510, 2003.

Tehrani, Survey of Stochastic Computation on Factor Graphs, ISMVL '07 Proceedings of the 37th International Symposium on Multiple-Valued Logic 2007.

Tehrani, Tracking Forecast Memories in Stochastic Decoders, IEEE ICASSP 2009.

* cited by examiner

```
      ‖FADL module contains the genVerilog function to
      ‖generate VERILOG.
    ┌ import FADL as f
 90 ┤
    └ import numpy as np ‖biadjacency matrix with three bits and a single check equation.
 92 → A = np.array ([[(1,1,1)]])

‖ Describe the hardware architecture and scheduling.
 94 → edgeGroups = [zip(*(A.nonzero()))]
 96 → physXors = [[0]]
 98 → xorGroups = [[0]]
      bitMemGroups = [range(0,3)] ← 100
      updateGroups = [[0]] ← 102

‖ Specify the output directory
104 → directory = "/home/fadl/fadl/output"

‖ Specify the xor, memCell, switch, cntrl, and test bench
      ‖circuits to use.
106 → customMudules = ("xor2x1":"../verilog/xor2x1min_sum_se.vams",\
                       "MemCell":"../verilog/mem_cell_se.vams",\
                       "switch":"../verilog/switch_se_vams,\
                       "cntrl":"../verilog/my_cntrl.v",\

"FactorGraphTestBench":"../verilog/FactorGraph_tb.vams")

‖ Specify a few additional modules for the irun command.
108 → additionalModules = ["../verilog/input_cntrl.v".\
                            "../verilog/compute_cntrl.v".\
                            "../verilog/output_cntrl.v",\
                            "top.vams",\
                            "../verilog/rom_using_file.v",\
                            "+access+r"]

‖ Set some parameters for the test bench
110 → numIterations = 1;
112 → debug = 1;

‖ Generate the verilog
      f.genVerilog(A,physXors,xorGroups,bitMemGroups,edgeGroups,\ updateGroups,directory,customModules,additionalModules,\
            numIterations,debug)
```

FIG. 14

```
import FADL as f
import numpy as np biadjacency matrix
A = np.array ([[1,1,1,0,1,0],\
               [1,1,0,1,0,1]])

edgeGroups = [zip(*(A.nonzero()))]
physXors = [[0,1]]
xorGroups = [[0]]
bitMemGroups = [range (0,A.shape [1])]
updateGroups = [[0], [1]]

directory = "/lyric/home/shawn/fadl/fadl/output"

customModules = { "xor2x1":"../verilog/xor2x1min_sum_se.vams",\
                  "MemCell":"../verilog/mem_cell_se.vams",\
                  "switch":"../verilog/switch.se.vams",\
                  "cntrl":"../verilog/my_cntrl.v",\

"FactorGraphTestBench":"../verilog/FactorGraph_tb.vams"} additionalModules = [ "../verilog/input_contrl.v",\
                      "../verilog/compute_cntrl.v",\
"../verilog/output_cntrl.v",\
                "top.vams",\
                "../verilog/rom_using_file.v",\
                "+access+r"]

numIterations = 20;
debug = 1;
#Generate verilog based on all of that information
f.gen Verilog(A, physXors, xorGroups, bitMemGroups,\
        edgeGroups, updateGroups, driectory, \
        customModules, additionalModules, numIterations, debug)
```

FIG. 16

IMPLEMENTATION OF FACTOR GRAPHS

CROSS-REFERENCE TO RELATED APPLICATIONS

This application claims benefit of U.S. Provisional Application Ser. No. 61/294,740, filed Jan. 13, 2010, titled "IMPLEMENTATION OF FACTOR GRAPH CIRCUITRY" and U.S. Provisional Application Ser. No. 61/306,842, filed Feb. 22, 2010, titled "FACTOR GRAPH MODELER," the contents of which are incorporated herein by reference.

STATEMENT AS TO FEDERALLY SPONSORED RESEARCH

This invention was made with government support under FA 8750-07-C-0231 awarded by Defense Advanced Research Projects Agency (DARPA). The government has certain rights in the invention.

BACKGROUND

This disclosure relates to factor graphs, and in particular, to the design and implementation of factor graphs in software and/or hardware.

At a high level, circuitry representing a belief propagation network can be represented as a factor graph having nodes connected by edges. Factor graphs are a powerful tool for describing statistical models such as hidden Markov models, Markov random fields, Kalman filters, and Bayes nets.

Given a set of n discrete random variables $a_1, a_2, \ldots, a_n$ the joint probability distribution is expressed as $p(a_1, a_2, \ldots, a_n)$. Suppose that the joint probability distribution factors in the following sense: there exist subsets $S_1, \ldots, S_k \subseteq \{1, 2, \ldots, n\}$ where $S_j = \{s_1^j, \ldots, s_{t(j)}^j\}$, such that $p(a_n, \ldots, a_n) = \Pi_{j=1}^{k} f_j(a_{s_1^j}, \ldots, a_{s_{t(j)}^j})$. For example, if the $a_i$ form a Markov chain, then the joint probability can be factored as $p(a_1, \ldots, a_n) = p(a_1) \Pi p(a_{j+1}|a_j) = f_0(a_1) \Pi f_j(a_j, a_{j+1})$ The factors above are normalized, in the sense that as the $a_i$ vary, the probabilities sum to one. The factors can be defined more generally such that they are only required to be proportional to the joint probability. So, we call the $f_i$ a collection of factors of p( ) if $$p(a_1, a_2, \ldots, a_n) \propto \prod_{j=1}^{k} f_j\left(a_{s_1^j}, a_{s_2^j}, \ldots, s_{t(j)}^j\right)$$

The product of the factors then differs from the joint probability only by multiplication by a normalizing constant.

When a probability distribution can be expressed as a product of small factors (i.e. $|S_j|$ is small for all j) it is possible to invoke a host of powerful tools for modeling and inference.

Given a factored representation of a joint probability distribution, it is possible to describe the structure of the factors as a graph. Each variable $a_i$ and each function $f_j$ can be represented by a node in the graph. An undirected edge can be placed between node $a_i$ and node $f_j$ if and only if the variable $a_i$ is an argument in the function $f_j$. These two types of nodes are referred to as function nodes (which in some contexts may also be referred to as factors or factor nodes) and variable nodes (which may also be referred to as equals nodes or equals processors in some contexts). Because all edges lie between the two disjoint classes of nodes, the resulting graph is bipartite. This graph is called a factor graph.

FIG. 1 is a graphical representation of a factor graph of the Markov chain expressed above in Equation 1, where $f_j(a_j, a_{j+1}) = p(a_{j+1}|a_j)$. It is clear from the figure that the bipartite factor graph includes two groups of nodes (i.e., $a_1 \ldots a_4$ and $f_0 \ldots f_3$).

Referring to FIG. 2, a factor graph of the more complex hidden Markov model (HMM) is illustrated. The factor graph of the HMM can be constructed by extending the Markov chain example of FIG. 1. In particular, an HMM contains a Markov chain transiting from state $a_i$ to $a_{i+1}$. Each state has an observation $b_i$ associated with it. Given $a_i$, then $b_i$ is conditionally independent of all other variables. This probability can be incorporated by using a factor $g_i(a_i) = P(b_i|a_i)$.

The product of the factors is:

$$f_0\left(\prod_{j=1}^{n-1} f_j(a_j, a_{j+1})\right)\prod_{j=1}^{n} g_j(a_j) = Pr(a_1)\left(\prod_{j=1}^{n-1} Pr(a_{j+1}|a_j)\right)$$
$$\prod_{j=1}^{n} Pr(b_j|a_j)$$
$$= Pr(a_1, \ldots, a_n, b_1, \ldots, b_n)$$

Since the $b_i$ are observed, then $Pr(b_1, \ldots, b_n)$ is a constant. Therefore, $$Pr(a_1, \ldots, a_n, b_1, \ldots, b_n) \propto \frac{Pr(a_1, \ldots, a_n, b_1, \ldots, b_n)}{Pr(b_1, \ldots, b_n)} = Pr(a_1, \ldots, a_n | b_1, \ldots, b_n)$$

as desired.

Note that the variables $b_i$ need not appear explicitly in the factor graph. Their effects can be incorporated into the $g_i$ factors.

Generalizing from a Markov chain to an HMM illustrates a very powerful feature of factor graphs. In particular, complicated mathematical models are often composed of simpler parts. When these models are expressed as factor graphs, simpler factor graphs can be used to construct more complicated factor graphs.

In some hardware implementations, the variable (equals) nodes of the factor graphs are implemented by equals processors, which output the sum of their inputs, and the factor nodes of the factor graphs are implemented by XOR processors, which output the XOR of their inputs. Both kinds of processors can include both analog and digital circuitry.

When designing circuitry for realizing a belief propagation network, it is common to first work with a logical representation of the network (e.g., a factor graph), rather than the actual circuit elements themselves.

Once the logical design of the network has been settled on, there remains the task of translating that logical design into an actual physical circuit. This typically involves having a hardware architect create a representation of the physical structure in a hardware descriptor language. A floor-planner uses this representation to determine where to place the circuit elements. The output of the floor planner and the representation of the physical design are then provided to a fabrication machine, which creates a physical template to be used in manufacturing the physical circuit corresponding to the logical design.

SUMMARY

In one aspect, the invention features a method for generating a hardware description of a belief propagation network.

Such a method includes receiving an initial representation of a belief propagation network having factor graph that includes nodes connected by edges; receiving a specification indicating that that a hardware element is to realize at least two nodes of the factor graph; generating empty nodes for receiving information representative of hardware modules for physically realizing the nodes; and on the basis of the initial representation and the specification, generating a hardware representation of an electronic circuit for implementing the factor graph.

In some practices of the invention, generating a hardware representation includes generating a hardware descriptor language representation of the specification. Other practices include generating a hardware representation by generating a VERILOG representation of the specification.

Alternative practices also include receiving a specification of hardware to be placed in the nodes.

Other practices include those in which receiving the specification includes receiving a specification of factor nodes to be implemented by a particular XOR-processor, and those in which wherein receiving the specification includes receiving a specification of variable nodes to be implemented by a particular equals-processor.

Additional practices include specifying additional hardware elements to enable the hardware element to realize at least two nodes of the factor graph. These can be carried out by, for example, specifying at least one switch, or by specifying at least one memory element.

Yet other practices of the invention include providing the hardware representation to a hardware simulator for simulation of the belief propagation network, or providing it to a floor planner for generating a floor plan of an integrated circuit for implementing the belief propagation network.

In another aspect, the invention features a manufacture having encoded thereon functional material, the functional material including instructions that, when executed by a data processing system, cause the system to receive an initial representation of a belief propagation network having factor graph that includes nodes connected by edges; receive a specification indicating that that a hardware element is to realize at least two nodes of the factor graph; generate empty nodes for receiving information representative of hardware modules for physically realizing the nodes; and on the basis of the initial representation and the specification, generate a hardware representation of an electronic circuit for implementing the factor graph.

In another aspect, a method is used for implementing a belief propagator. Such a method includes defining a plurality of factor graph objects that collectively model a factor graph having nodes connected by edges, wherein messages are passed between nodes along the edges; specifying an active solver to execute belief propagation on the factor graph model; and causing the objects to associated themselves with the particular solver.

Some practices further include causing a factor graph object to define a variable as a boundary variable.

Other practices further include specifying a new solver to execute belief propagation on the factor graph model without altering the factor graph model.

Yet other practices include receiving instructions to define discrete variables with a finite domain and an arbitrary set of dimensions.

Among the other practices are those that include using operator overloading to cause a variable to appear as a matrix to the active solver, those that include determining whether a coefficient table is to be provided to the active solver, and if so, generating the table, those that include identifying a constraint function (e.g., factors representing hard or probabilistic (soft) constraints) and a set of variable nodes, Another practice includes determining that a coefficient table exists for the constraint function, and those that include determining that a function node is to be hand-coded, and determining that no coefficient table needs to be provided to the active solver.

In another aspect, the invention features a computer-readable medium having encoded thereon software for implementing a belief propagator, the software included instructions for causing execution of any combination of the foregoing methods.

In yet another aspect, the invention features a data processing system configured to execute software for implementing a belief propagator, the software including instructions for causing execution of any combination of the foregoing methods.

These and other features of the invention will be apparent from the following detailed description and the figures.

DESCRIPTION OF THE FIGURES

FIGS. 14 and 16 show example FADL representation for implementing the factor graphs shown in FIGS. 15 and 17 respectively;

DETAILED DESCRIPTION

The process of implementing a belief propagation network in software and/or hardware can begin with a factor-graphdesigner who designs a factor graph that implements that network. As is described above, factor graphs enable designers to create a graphical model of complicated belief propagation networks such as Markov chains, hidden Markov models, Bayesian networks, etc. Properly designed factor graphs enable the efficient computation of marginal distributions.

Using conventional techniques, factor graph designers may face significant challenges in transforming factor graphs into properly designed hardware (e.g., an ASIC hardware representation of a factor graph) or software. For instance, factor-graph-designers have not had simulation tools to ensure that a final hardware device will comply with a factor graph design. Additionally, generating satisfactory hardware layouts can be difficult and problems in the generated layouts may not be discovered until the relatively late integrated circuit development cycle. Problems discovered at late stages can be extremely costly in both time and money.

The following description relates to a development system that aids development tasks including one or more of the prototyping, specification, simulation, fabrication of hardware, and compiling and execution of software code for belief propagation networks using factor graphs.

Figure 1:
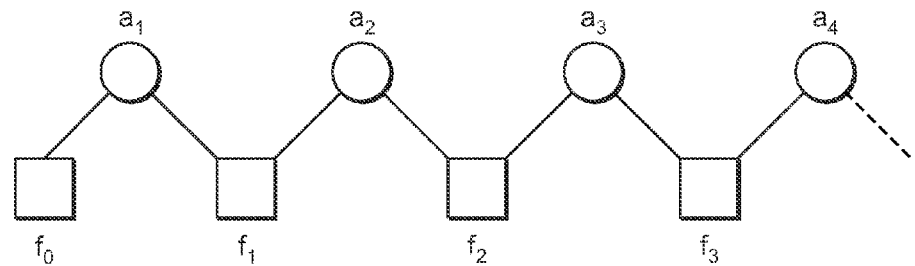
FIG. 1 shows a factor graph of a Markov chain.
Figure 2:
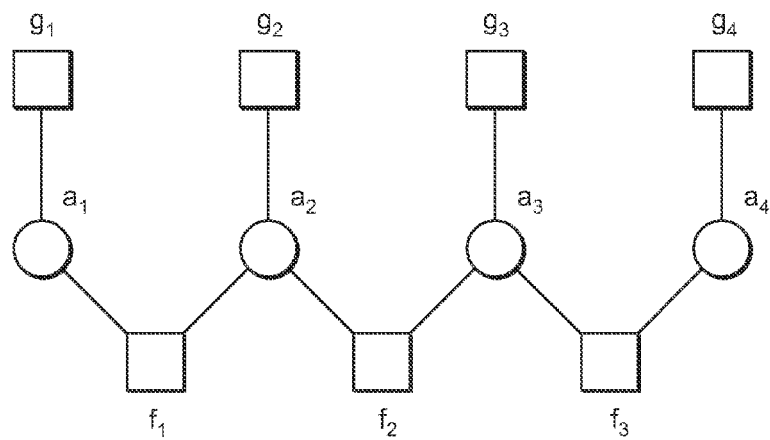
FIG. 2 shows a factor graph of a hidden Markov model.
Figure 3:
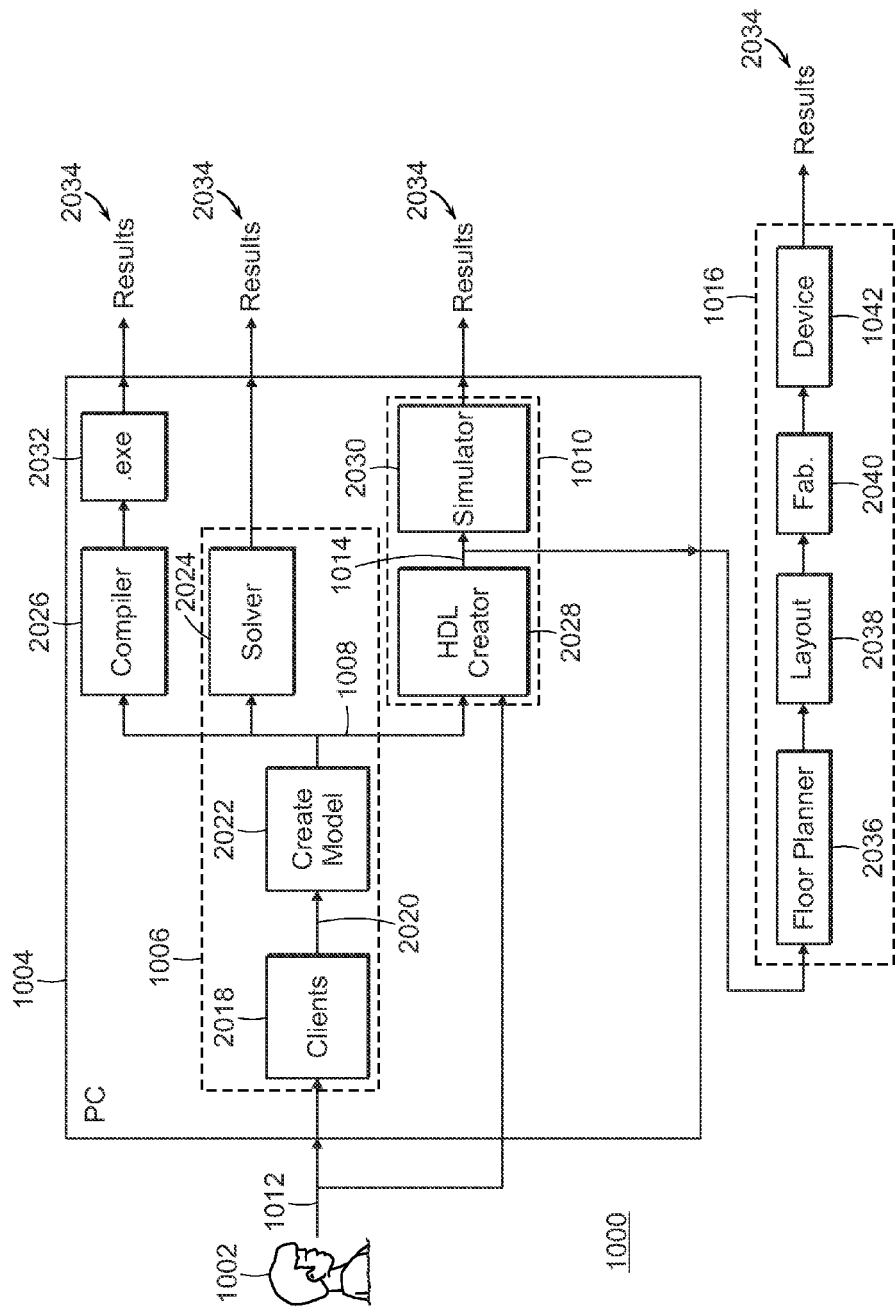
FIG. 3 shows a detailed view of modules of a development system.

Referring to FIG. 3, embodiments of a factor graph development system 1000 support one or more of the development paths shown in the figure. For example, in an example of using the development system to design a hardware implementation, a factor-graph-designer 1002 interfaces with a computer 1004 to design and implement a factor graph. For example, in a software synthesis case, the factor-graph-designer 1002 specifies a factor graph by providing input 1012 to a factor graph modeler using a syntax of a Distributed Mathematical Programming Language (DMPL) 1006. As another example, in a hardware synthesis case, the specification of the factor graph 1008 is passed to a Factor Graph ASIC Description Language (FADL) module 1010 where, based on input 1012 from the factor-graph-designer 1002, a hardware definition language (HDL) (e.g., VERILOG) representation of the factor graph 1014 is generated. The HDL representation of the factor graph 1014 can then be passed to a device fabrication process 1016 through which a device 1042 that implements the factor graph is ultimately fabricated.

In an example use of the development system for a software implementation, the factor-graph-designer 1002 provides user input 1012 to a computer 1004 to specify a factor graph. The user input 1012 utilizes 'clients' 2018 which in some examples implement classes of functions. For example, the clients can include the FactorGraph, Variable, and Factor classes. The result of the factor-graph-designer's 1002 use of the clients 2018 is a problem specification 2020. The problem specification 2020 can represent the nodes present in the specified factor graph, the edges present in the specified graph, and how the nodes and edges are interconnected.

The problem specification 2020 is passed to a model creation module 2022 where a model 1008 of the factor graph is created. The model 1008 is an object that can be used to produce a number of different results. In particular, the model can be used to solve the factor graph within the DMPL environment 1006, compile an executable file 2032 that solves the factor graph independent of any programming environment, or the model can be passed to FADL 1010 where it may be used to generate a hardware implementation of the factor graph.

To solve the factor graph within DMPL 1006, the model of the factor graph 1008 is passed to the solver module 2024. In some examples, the solver module 2024 implements a belief propagation algorithm (e.g., the Sum-Product algorithm) to generate results 2034 (e.g., marginal distributions at the nodes of the factor graph). The factor-graph-designer 1002 may compare the results of the solver module 2024 to the results produced by FADL 1010 (e.g., the hardware device results or the simulation results) for the purpose of verifying that the factor graph design is correct.

In some examples, it may be desirable to solve the factor graph outside of the DMPL environment 1006. In such situations, the factor graph model 1008 may be passed to a compiler 2026 that compiles the model 1008, for instance including the solver algorithm, into a machine executable file 2032. The file may be run at a later time to solve the factor graph and produce results 2034.

In other examples, the model 1008 may be passed to the FADL module 1010. In addition to the factor graph model, the FADL module 1010 may accept input 1012 from the factor-graph designer 1002. For example, adjacency matrices, inputs and outputs, and sub-lists may be provided by the user (the inputs to FADL are discussed further in Section 3 below). The inputs to the FADL module 1010 are then passed to an HDL transcription module 2028 that generates an HDL representation (e.g., in VERILOG) of the factor graph 1014. The factor-graph-designer 1002 may pass the HDL representation of the factor graph 1014 to an HDL simulation module 2030 (e.g., SPECTER). The HDL simulation module 2030 can execute the HDL representation of the factor graph 1014, producing results 2034. The results of the HDL simulation module 2030 can be compared to the results of the DMPL solver 2024 for the purpose of verifying that the HDL representation of the factor graph 1014 will generate the desired factor graph results 2034.

The HDL representation of the factor graph 1014 can also be passed to a floor planner 2036, for example, in a device fabrication process 1016 (referred in some instances below as an ASIC "foundry", without intending to limit the meaning, for instance, only to a physical fabrication step). The floor plan developed by the floor planner 2036 can be passed to a layout module 2038, which determines the placement of integrated circuit components on the integrated circuit device 1042. The result of the layout module 2038 can be passed to a fabrication module 2040 which can use the layout to create one or more integrated circuit devices 1042. The integrated circuit devices 1042 can be used to solve the factor graph, generating results 2034. The results of the integrated circuit devices 1042 should be the same as those of the HDL simulation 2030, DMPL solver 2024, and compiled executable 2032.

1 DMPL

DMPL is an example of a modeling tool that provides a concise way for a factor-graph-designer to describe factor graphs with only a few lines of code. DMPL enables the rapid prototyping of algorithms that can be described with factor graphs and solved with belief propagation algorithms (e.g., the Sum-Product algorithm).

DMPL provides factor-graph-designers with 'clients' and 'solvers.' Factor-graph-designers specify factor graphs using the clients and then pass the specified factor graphs to the solvers which perform belief propagation on the factor graphs to solve real world problems.

One embodiment of DMPL is implemented using MATLAB classes and operator-overloading. The reader should understand, however, that while the described embodiment is implemented in MATLAB, a number of other programming languages could be used to implement an equivalent application.

Figure 4:
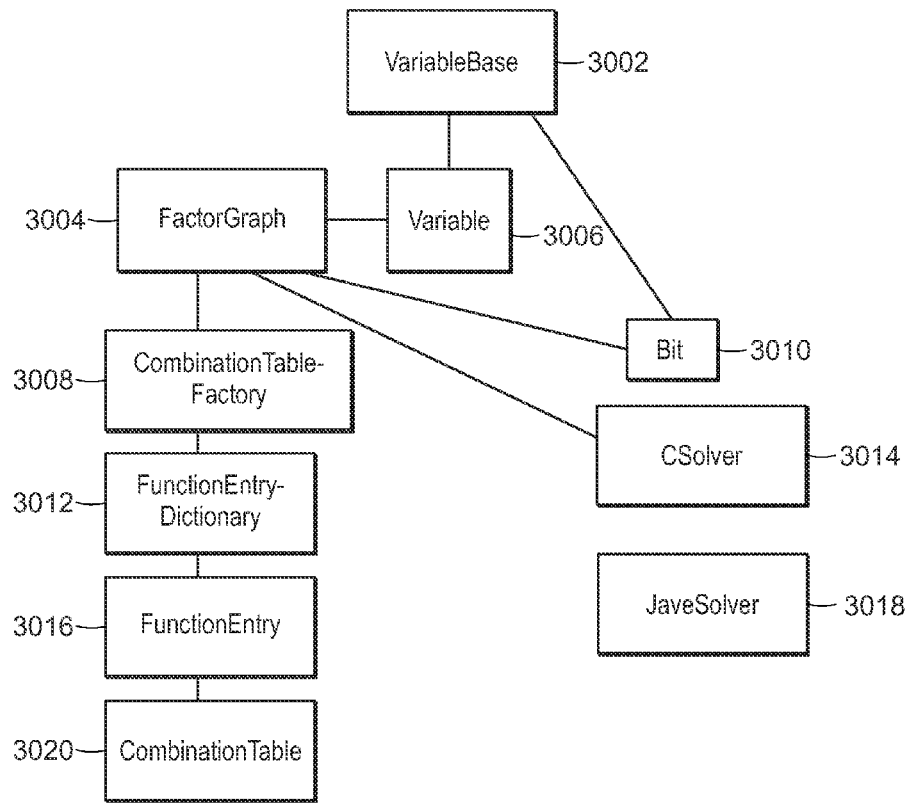
FIG. 4 shows the class structure of an embodiment of DMPL.

Referring to FIG. 4, the class structure of such a modeling tool is shown. As shown, the selected solver being used for the model, i.e. the "active solver," is a C++ solver. However, one could also select the Java Solver 3018 in FIG. 4, or any other solver to be the active solver.

1.1 Clients

DMPL includes classes of functions called 'clients' that provide a user interface that hides unnecessary implementation details from the user. The clients represent the main components of factor graphs and provide the user with the tools to construct a factor graph. In some examples, DMPL includes three clients: FactorGraph, Variable, and Factor.

1.1.1 FactorGraph Client

The FactorGraph client can be used to instantiate the initial factor graph structure as follows:

```
FG=FactorGraph( );
```

The instantiated factor graph is the foundation on which the user can build a factor graph by adding nodes (variables and factors) and edges.

Referring to FIG. 4, internally, the FactorGraph 3004 constructor assigns the currently active solver to the FactorGraph 3004 instance and retrieves a new unique factor graph ID to represent this graph from the solver. Additionally, the constructor creates a CombinationTableFactory 3008 instance. The CombinationTableFactory 3008 is responsible for generating coefficient tables, which are discussed further below.

In some examples, the user may pass variables as arguments to the constructor. In such cases, the factor graph object associates these variables with the factor graph and informs the solver that they are boundary variables.

1.1.2 Variable Client

The Variable client of the DMPL modeler allows users to define discrete variables with a finite domain and an arbitrary set of dimensions for the factor graph.

In some examples, the DMPL modeler internally uses operator overloading to make it appear as though variables are matrices. Referring to FIG. 4, the class diagram shows a VariableBase 3002 base class that is extended by the Variable 3006 class and by the Bit 3010 class. VariableBase 3002 provides most of the implementation and Variable 3006 and Bit 3010 simply provide specific mechanisms to set priors and retrieve beliefs.

For example, the Variable 3006 class can be specified with a first argument as the domain and the remaining arguments as the size of an arbitrary number of dimensions, as shown below:

```
v=Variable({2,4+i,{5,6}},3,4);
```

The foregoing command creates a 3×4 matrix of discrete variables with three elements in its domain named v. The domain is specified as a cell array of any legal type (e.g., any legal MATLAB type). The modeler provides some shorthand mechanisms for specifying domains, such as a single vector, where each number is a single domain item.

The Variable 3006 constructor does not create a true MATLAB matrix. Instead, the Variable 3006 constructor creates a Variable 3006 instance. The modeler VariableBase 3002 code retrieves 3*4=12 variable identifiers from the solver to uniquely identify each variable in the matrix, stores these variable identifiers as a true MATLAB matrix, and informs the solver of the domain length for each of these variables.

Because Variable 3006 is a class instance and not a matrix, methods and properties can be invoked on it. For example, the following code calls the "getter" on the "Beliefs" property of the variable v.

```
v.Beliefs
               0.3333  0.3333  0.3333  0.3333
ans(:, :, 1) = 0.3333  0.3333  0.3333  0.3333
               0.3333  0.3333  0.3333  0.3333

0.3333  0.3333  0.3333  0.3333
ans(:, :, 2) = 0.3333  0.3333  0.3333  0.3333
               0.3333  0.3333  0.3333  0.3333

0.3333  0.3333  0.3333  0.3333
ans(:, :, 3) = 0.3333  0.3333  0.3333  0.3333
               0.3333  0.3333  0.3333  0.3333
```

In the preceding example, a third dimension is added to specify the three probabilities (one for each domain item), so that 3*4*3 values are returned. Internally, the VariableBase 3002 code converts the 3*4 matrix of variable identifiers to a 12×1 vector of Variable identifiers and asks the solvers for the "Beliefs" of these Variable 3006 identifiers. Upon receiving these results, it reshapes them into the correct size matrix and returns the matrix.

The following example demonstrates the implementation of MATLAB slices:

```
v(1:2,1).Priors = [.4 .4 .2; .2 .4 .4];
v(1:2,1).Beliefs
ans =
    0.4000 0.4000 0.2000
    0.2000 0.4000 0.4000
```

The preceding example retrieves the first and second rows of the first column of Variables, assigns priors, and observes the new "Beliefs." Again, the subscripting operator is overloaded, the slice parameters are caught, the variable identifiers are retrieved from the internal Variable identifier matrix, and the solver is invoked to set the priors on the appropriate variables (two in this case). In the second line, the solver is used to retrieve beliefs on the same set of variables.

The following example illustrates how variables and sub matrices can be concatenated.

```
vnew = [v(1:2,1) v(2:3,3)]
vnew =
   Variable handle
   Properties:
       Beliefs: [2x2x3 double]
       V: [2x2 struct]
       Solver: [1x1 CSolver]
       Domain: {[2] [4.0000 + 1.0000i] {1x2 cell}}
```

The subscripting returns new Variable classes representing matrices of Variables, and the VariableBase and Variable classes override the "horzcat" and "vertcat" operators so that Variables can be concatenated vertically and horizontally.

Transpose is implemented via the same operator overloading mechanism.

```
v = v'
v =
   Variable handle
```

```
                Properties:
                    Beliefs: [4x3x3 double]
                    V: [4x3 struct]
                    Solver: [1x1 CSolver]
                        Domain: {[2] [4.0000 + 1.0000i] {1x2 cell}}
```

DMPL ensures that matrices of variables only contain variables with the same domains. As such, the user can retrieve the single Domain associated with a Variable Matrix as follows:

```
                    v.Domain
                    ans =
                        [2] [4.0000 + 1.0000i] {1x2 cell}
```

DMPL may also support reshaping via function overloading as follows:

```
            v = reshape(v,6,2)
            v =
                Variable handle
                Properties:
                    Beliefs: [6x2x3 double]
                    V: [6x2 struct]
                    Solver: [1x1 CSolver]
                    Domain: {[2] [4.0000 + 1.0000i] {1x2 cell}}
```

The other class in the Variable 3006 class hierarchy is the Bit 3010 class. Bit objects can be instantiated as follows:

```
                    b = Bit(2,3);
                    b
                    b =
                        Bit handle
                        Properties:
                            Beliefs: [2x3 double]
                            V: [2x3 struct]
                            Solver: [1x1 CSolver]
                            Domain: {[1] [0]}
                            Values: [2x3 double]
```

A Bit is implemented as a VariableBase with a domain of {1,0}. The "Beliefs" and "Priors" methods have also been modified to take single arguments per element in the matrix since probabilities are normalized. All priors and beliefs are interpreted as the probability of 1. Probability of 0 can be inferred as (1—probability of 1).

1.1.3 Factor Client

The Factor client can be used to create the factor nodes of the factor graph. For example, the user may define a function that returns a probability based on some input states. The factors can then be added to the factor graph as follows:

```
            FG.addFactor(@function,inputState1,inputState2);
```

The user specifies factor graph factor nodes and associates variables with a factor graph by calling the "addFactor" method on a "FactorGraph" class instance. The "addFactor" method carries out numerous functions in the DMPL modeler, including automatically associating variable nodes with the factor graph, and determining that a coefficient table is not needed, for example, when such a table has already been generated for a given constraint function and set of variable domains, or when a factor node is to be hand-coded. If a coefficient table is in fact necessary, the "addFactor" attends to its creation.

Users are allowed to specify their own constraint functions. However, the DMPL modeler provides a several commonly used constraint fuctions. One such constraint function is "xorDelta", which is shown below:

```
                function valid = xorDelta(varargin)
                    total = 0;
                    for i = 1:length(varargin)
                        total = total+sum(varargin{i});
                    end
                    valid = mod(total,2) == 0;
                end
```

This "xorDelta" constraint function accepts a variable argument list of numbers and vectors. For each argument, it calls sum (to sum the elements of a vector) and adds this to the total. Finally it returns mod(total,2)=0. The net effect is that "xorDelta" returns "1" if its arguments contain an even number of 1's and returns "0" if its arguments contain an odd number of 1's.

The following two examples show different ways to add a function given the flexibility of the "xorDelta" constraint function.

```
                    b = Bit(3,1);
                    fg.addFactor(@xorDelta,b);
                    B = Bit(3,1);
                    fg.addFunc(@xorDelta,b(1),b(2),b(3));
```

Going back to the UML diagram, each factor graph instance contains a CombinationTableFactory 3008. In another embodiment, a FactorGraph definition can share a single CombinationTableFactory 3008 so as to avoid generating tables when an identical constraint function and domain list are specified. This CombinationTableFactory 3008 is used to retrieve or generate the coefficient table as necessary and to pass the coefficient table to the solver.

The modeler can retrieve the constraint function string (in this case "xorDelta") from the first argument. It asks the solver if it has implemented a version of this constraint function. If it has, the DMPL modeler will simply pass it the variable list and tell it to instantiate that factor node with the variable list that was passed. This can be used to avoid costly coefficient table generation.

Assuming the solver has not implemented a factor node specifically for this MATLAB function, the factor graph will pass the constraint function and the variable argument list to the CombinationTableFactory 3008 which is responsible for retrieving (or generating) the necessary coefficient table.

The FunctionEntryDictionary 3012 is a mapping from function names ("xorDelta") to a list of coefficient tables contained in the FunctionEntry 3016 class instance. There is no one-to-one mapping between coefficient tables and function entries because "xorDelta", and other constraint functions, can be called with different argument lists. Argument lists that contain different domains will likely result in different coefficient tables.

The next step is to scan through the FunctionEntry 3016 that was retrieved for the function name (if it exists), and to try to match the given argument list to a domain list in the FunctionEntry array. To "match" means that the variable argument list contains a set of variables with the same dimensions and domains as the array item being examined. In the case of a match, the existing coefficient table is returned and the solver is instructed to instantiate a factor node with that table. Another optimization only passes the coefficient table to the solver once, and, in future cases, refers to it by identifier. Another embodiment could throw out the tables once it has been generated and associated to an identifier in the solver, since the solver would then be holding onto the table as well.

Efforts to avoid unnecessary creation of a coefficient table are useful because, when generating the table from scratch, if there are m arguments with n items in their domains, the time to generate the coefficient table is $O(m^n)$.

Since any zero entries in the coefficient table can be skipped during belief propagation, it is useful to compress the coefficient table by removing all entries for which the constraint function returned zeros. As a result, if the user adds the three-bit XOR factor nodes, the cost of building the coefficient table is incurred only once.

To actually build the coefficient table, the modeler enumerates all combinations of the variables that were specified in the "addGraph" call and calls the constraint function with each of these combinations. The modeler then saves the indices of the domains in one table and the results of the constraint function in another matching vector. It then ensures that the order of the variables, when calling the constraint function, match the order of the variables passed to the "addFactor" call.

Finally, the user can specify constants, rather than variables, as arguments to the "addFactor" call. In these cases, the DMPL modeler simplifies the implementation by creating a "Variable" with a single domain item matching that constant.

1.2 Models

A model is a representation of a factor graph that includes the nodes and the information indicating the interconnections between the nodes. DMPL applies belief propagation algorithms to the model for the purpose of solving the factor graph represented by the model. The model is kept separate from the solver because a user (e.g., a factor-graph-designer) may want to solve the factor graph specified in the model using two different solvers. In some cases switching solvers would require an undesired and possibly time consuming regeneration of the model.

1.3 Solvers

All created DMPL objects associate themselves with the currently selected DMPL solver using the getSolver( ) function. The solvers execute a belief propagation algorithm such as the Sum Product, Min Sum, and Gibbs algorithms. The user may choose to associate objects with a different a preexisting solver to use or the user may define a custom solver. The desired solver can be selected using the setSolver( ) function. For example, the Min Sum solver algorithm could be selected as follows:

setSolver(MinSumSolver( );

A DMPL solver can be used to solve a factor graph object as follows:

FactorGraph.solve;

The belief propagation algorithms executed by the solvers are iterative message-passing algorithms where messages pass along the edges of the factor graph. A "message" can be viewed as an un-normalized probability distribution. Different solvers include different message update rules and different message update orders.

For example, the Sum Product algorithm generalizes a number of algorithms, including the "forward-backward" algorithm of HMMs, and the BCJR algorithm of coding theory. It always gives the exact answer (upon convergence), when the underlying factor graph is a tree. Although it is not an exact algorithm for general graphs, belief propagation has been found to give excellent results for a wide variety of factor graphs, and runs particularly fast on sparse factor graphs (i.e. factor graphs of low node and factor degree).

1.4 Nested Graphs

The modeler retrieves the variable identifiers for the variables specified in the "addGraph" call and the graph identifier for the factor graph to be nested. It then makes a call to "addGraph." Some embodiments include error checking to ensure the ordering and dimensionality of the Boundary Variables match.

1.5 Debugging

The user can retrieve Priors and Beliefs and can run single iterations and re-examine Beliefs. With some modification, the user can probe the connectivity of the graph, for example by entering instructions such as:

```
List_of_connected_functions = v.ConnectedFunctions;
f = fg.addFunc(<args>);
list_of_connected_variables = f.ConnectedVariables;
```

1.6 Python Modeler

Because of the separation between modeler and solver, it is possible to create modelers in other languages that can share solvers. One example is a Python solver that provides many of the same features as the MATLAB DMPL modeler. The Python modeler can be extended to support matrix operations and to use operator overloading in a similar way.

1.7 Custom Scheduling

In some embodiments, the modeler permits a user to specify a message-passing schedule. In such embodiments, edges can be specified as by the pairs (Factor,Variable) or (Variable, Factor). A schedule can be specified as a list of edges. The Python modeler implements such a specification by using the "setSchedule" method, which takes a list of tuples of variables and factors. The modeler converts these variables and functions to their variable identifiers and function identifiers, and makes a call to "setSchedule" on the solver.

The MATLAB embodiment of DMPL can also be readily modified to allow a user to specify a cell array of 2×1 cell arrays containing the pairs of functions and variables to accomplish the same goal. The existing MATLAB DMPL modeler does not return function instances with the "addFactor" call, but could easily be extended to do so.

1.8 Examples

The following section illustrates the use of DMPL to specify and solve factor graphs for some exemplary belief propagation problems.

1.8.1 Hidden Markov Model

To illustrate how DMPL can be used to create and solve a simple factor graph, an example is presented. The example is the common Rainy/Sunny hidden Markov Model (HMM).

In the problem, two friends who live far apart, Alice and Bob, have a daily phone conversation during which Bob mentions what he has been doing during the day. Alice knows that Bob's activity on a given day depends solely on the weather on that day, and knows some general trends about the evolution of weather in Bob's area.

Alice believes she can model the weather in Bob's area as a Markov chain with two states 'Sunny' and 'Rainy'. She remembers hearing that on the first day of last week it was quite likely (70% chance) that it was sunny in Bob's town. She also knows that a sunny day follows another sunny day with 80% chance, while a sunny day succeeds a rainy day with 50% chance.

She knows Bob pretty well, and knows that Bob only ever does one of three things: stay inside to read a book, go for a walk, or cook. She knows that if it is sunny, Bob will go for a walk with 70% probability, cook with 20% probability, and stay inside with 10% probability. Conversely, if it is rainy, Bob will go for a walk with 20% probability, cook with 40% probability, and stay inside with 40% probability.

Bob told Alice that he went for a walk on Monday, Tuesday, and Thursday, cooked on Wednesday and Friday, and read a book on Saturday and Sunday.

Alice wants to know what the most likely weather is for every day of last week. The above naturally defines an HMM which can easily be modeled within DMPL.

The first step to solving this problem in DMPL is to create a factor graph using the FactorGraph( ) command.

```
HMM=FactorGraph( );
```

Next, the variables of the factor graph are defined. In this example there are seven variables, MondayWeather . . . to SundayWeather. The command to create a variable is Variable (domain,dimensions). The domain includes the two distinct values 'Sunny' and 'Rainy'. For now, dimensions are not specified.

```
Domain={'sunny','rainy'};
MondayWeather=Variable(Domain);
```

-continued

```
TuesdayWeather=Variable(Domain);
WednesdayWeather=Variable(Domain);
ThursdayWeather=Variable(Domain);
FridayWeather=Variable(Domain);
SaturdayWeather=Variable(Domain);
SundayWeather=Variable(Domain);
```

Next, the different factors of the factor graph are added. First, the factors corresponding to the Markov Chain structure are added. This can be done with the command addFactor( ), which is a method of the previously defined factor graph. The command has syntax addFactor(funchandle,arguments), where funchandle is the handle of a function (e.g., a regular MATLAB function) which can be specified by the user, and the arguments are the variables involved in the factor being defined (in the same order as the inputs of the function). The number of inputs of the function referred to by the function handle has to be equal to the number of arguments of addFactor( ). The function for the example can be defined as:

```
function [probability]=MC_transition_Tutorial(state1,state2)
switch state1
    case 'sunny'
        if state2=='sunny'
            probability=0.8;
        else
            probability=0.2;
        end
    case 'rainy'
        probability =0.5;
end
```

Next, the factors are added to the factor graph using the addFactor( )method

```
HMM.addFactor(@MC_transition_Tutorial,MondayWeather,TuesdayWeather);
HMM.addFactor(@MC_transition_Tutorial,TuesdayWeather,WednesdayWeather);
HMM.addFactor(@MC_transition_Tutorial,WednesdayWeather,ThursdayWeather);
HMM.addFactor(@MC_transition_Tutorial,ThursdayWeather,FridayWeather);
HMM.addFactor(@MC_transition_Tutorial,FridayWeather,SaturdayWeather);
HMM.addFactor(@MC_transition_Tutorial,SaturdayWeather,SundayWeather);
```

The factors corresponding to the observations of each day are then added. When using an addFactor( ) command, the arguments need not be all random variables; some can be declared as constants. Thus, the addFactor( ) function can also be used to add observation factors as follows:

```
function [probability]=observation_function_Tutorial(state,observation)
switch state
    case 'sunny'
        switch observation
            case 'walk'
                probability=0.7;
            case 'book'
                probability=0.1;
            case 'cook'
                probability=0.2;
        end
    case 'rainy'
        switch observation
            case 'walk'
                probability=0.2;
            case 'book'
                probability=0.4;
            case 'cook'
                probability=0.4;
        end
```

```
end
HMM.addFactor(@observation_function_Tutorial,MondayWeather,'walk');
HMM.addFactor(@observation_function_Tutorial,TuesdayWeather,'walk');
HMM.addFactor(@observation_function_Tutorial,WednesdayWeather,'cook');
HMM.addFactor(@observation_function_Tutorial,ThursdayWeather,'walk');
HMM.addFactor(@observation_function_Tutorial,FridayWeather,'cook');
HMM.addFactor(@observation_function_Tutorial,SaturdayWeather,'book');
HMM.addFactor(@observation_function_Tutorial,SundayWeather,'book');
```

Though the functions themselves depend on two variables, each factor only depends on one random variable (the other argument being set as a constant during the addFactor( ) call). This in effect creates a factor connected only to one variable of the factor graph.

Finally, the prior probabilities for the MondayWeather variable are added using the input method. For a vector of probabilities (i.e. nonnegative numbers which sums up to one), the method Variable.Input adds a single factor, which depends on this variable only, with values equal to those given by the vector.

For this example, the input method is used as follows:

MondayWeather.Input=[0.7 0.3];

The factor graph can then be solved using the solve( ) iterate( ) and NumIterations( ) factor graph methods as is illustrated in the following example code. First, the number of iterations is chosen and then the solver is run for that many iterations.

HMM.NumIterations=20;

HMM.solve;

In some examples, the solve command executes the Sum-Product algorithm using a flooding schedule. A flooding schedule can be described as first computing all equals nodes, then computing all function nodes, and repeating for a specified number of iterations.

After the solver has finished running, the resulting marginal distribution of each variable can be accessed using the Belief command as follows:

TuesdayWeather.Belief

The Belief command can return a vector of probabilities of the same length as the total size of the domain (i.e. the product of its dimensions), including the probability of each domain variable.

1.8.2 Four Bit XOR

The following is a more complex example that includes defining a factor graph with 4 variables tied through a 4-bit XOR, with prior probabilities.

Given a set of four random variables ($B_1$, $B_2$, $B_3$, $B_4$) taking values 0 or 1. The joint probability distribution is given by:

$$P(B_1,B_2,B_3,B_4)=\delta_{(B_1+B_2+B_3+B_4=0(mod\ 2))}P(B_1)P(B_2)P(B_3)P(B_4)$$

where the delta function $\delta( )$ is equal to 1 if the underlying constraint is satisfied, and 0 otherwise (this ensures that illegal assignments have probability zero). The $P(B_i)$ are single variable factors which help model which values of $B_i$ are more likely to be taken (Typically, the factor will represent an observation of $O_i$ of variable $B_i$, and the factor $P(B_i)$ is set equal to the normalized function $P(O_i|B_1)$. For this example, $P(B_1=1)=P(B_2=1)=P(B_3=1)=0.8$ and $P(B_4-1)=0.5$.

The factor graph for this example can be built in two different ways. The first directly uses a 4-bit XOR, and uses mostly tools seen in the previous example. The second introduces the Bit kind of random variable, and how to use an intermediate variable to reduce the degree of a factor graph with parity checks (i.e. XOR function).

The first way of building the factor graph uses an inefficient N-bit XOR function defined as follows:

```
function [valid]=BadNBitXorDelta_Tutorial(variables)
    valid=mod(sum(variables),2)==0;
end
```

Based on the previous example, the sequence of instructions used is:

```
FourBitXor=FactorGraph( );
Domain=[0;1];
B1=Variable(Domain);
B2=Variable(Domain);
B3=Variable(Domain);
B4=Variable(Domain);
FourBitXor.addFactor(@BadNBitXorDelta_Tutorial,[B1,B2,B3,B4]);
B1.Input=[0.2 0.8];
B2.Input=[0.2 0.8];
B3.Input=[0.2 0.8];
B4.Input=[0.5 0.5];
FourBitXor.NumIterations=30;
FourBitXor.solve;
disp(B1.Value);
```

Note that the Variable method 'Value' returns the most likely assignment of that random variable.

The second version of the 4-bit XOR uses Bit variables to represent the random variables. Furthermore, it will decompose the 4 bit XOR into two 3-bit XORs. It can be proven that $B_1+B_2+B_3+B_4=0(\mod 2)$ is equivalent to $B_1+B_2+C=0(\mod 2)$ $B_3+B_4+C=0(\mod 2)$ for an internal bit C. Furthermore, any N-bit XOR can be reduced to a tree of 3-bit XORs, with depth log(N). The complexity of running a belief propagation algorithm is exponential in the degree of factors. Thus, using this technique leads to dramatic speed improvements.

Figure 5:
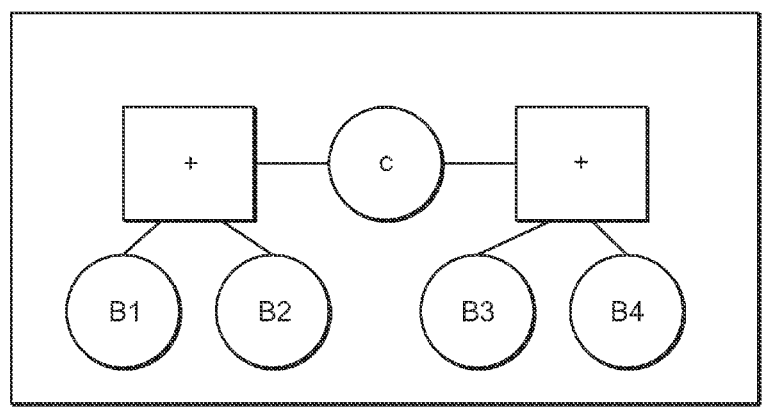
FIG. 5 shows a factor graph of a 4-bit XOR decomposed into two 3-bit XORs.

Referring to FIG. 5, a factor graph of a 4-bit XOR decomposed into two 3-bit XORs is illustrated. This factor graph can be defined as follows:

```
function valid = XorDeltaTutorial(x,y,z)
    valid = bitXor(bitXor(x,y),z);
end
XorGraph = FactorGraph( );
b = Bit(4,1);
c = Bit( );
XorGraph.addFactor(@XorDeltaTutorial,b(1),b(2),c);
XorGraph.addFactor(@XorDeltaTutorial,b(3),b(4),c);
b.Input = [ .8 .8 .8 .5];
```

-continued

```
XorGraph.NumIterations = 2;
XorGraph.solve( );
disp(b.Belief);
disp(b.Value);
```

1.8.3 Nesting Factor Graphs

Figure 6:
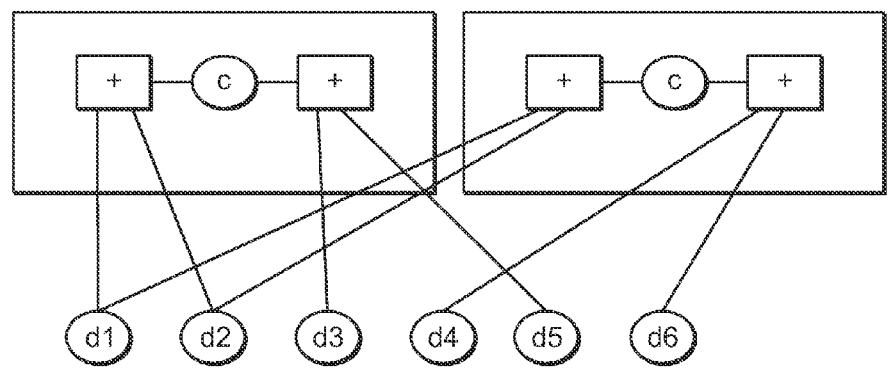
FIG. 6 shows a nested factor graph using two 4-bit XORs to create a 6-bit code.

As was previously mentioned, in some examples it is useful to re-use previously created factor graphs as building blocks for larger factor graphs. For example, two 4-bit XORs from the previous example can be used to create a 6-bit code as shown in the factor graph of FIG. 6.

In order to specify a nested factor graph, DMPL provides a way to replicate multiple copies of a factor graph and nest these instances in a containing factor graph. A nested factor graph can be seen as a special factor function between a set of variables ('connector variables'), which, when 'zoomed in,' is in fact another factor graph, with factors involving both the connector variables, and other 'internal variables.'

In the second version of the XOR tutorial, a 4-bit XOR connected to 4 variables was created, by also creating an extra Bit C. Nested factor graphs enable the use of such a 4-bit XOR to create potentially many different sets of 4 bits, overlapping or not, by replicating the factor graph as needed.

A nestable factor graph is created by specifying first a set of 'connector' random variables, and invoking the command FactorGraph(S).

Figure 7:
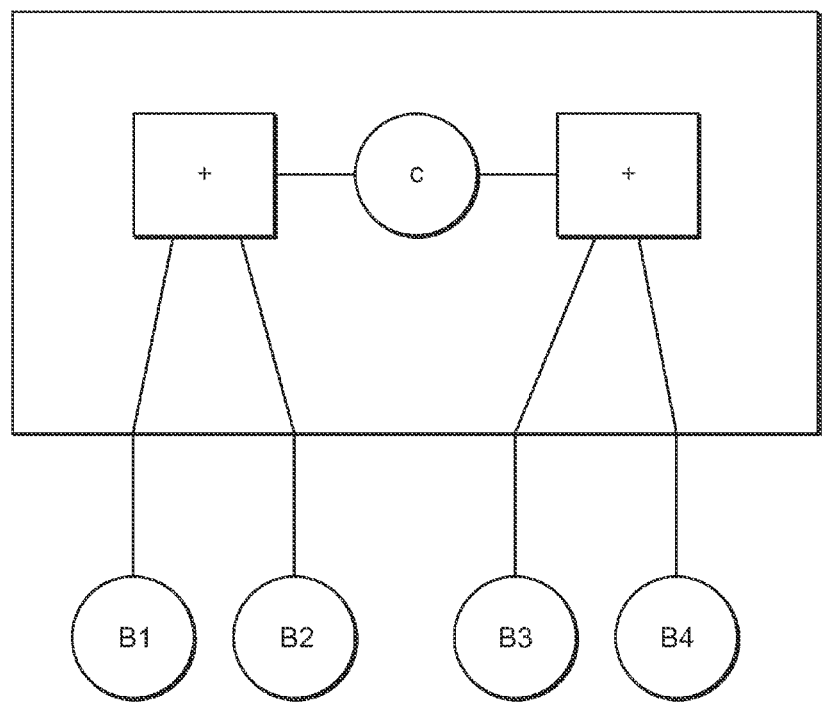
FIG. 7 shows a nested factor graph of a 4-bit XOR created from two nested 3-bit XORs.

FIG. 7 illustrates a factor graph that includes nested factor graphs. The following code creates specifies the factor graph illustrated in FIG. 7:

```
%Define 4 bit Xor from two 3 bit Xors
%%%%%%%%%%%%%%%%%%%%%%%%%%%%%%%%%%%%%%%%%%%%%%%%
b = Bit(4,1);
XorGraph = FactorGraph(b);
c = Bit( );
XorGraph.addFactor(@XorDeltaTutorial,b(1),b(2),c);
XorGraph.addFactor(@XorDeltaTutorial,b(3),b(4),c);
```

FIG. 14 illustrates the factor graph specified by the preceding code.

2 Hardware implementation of DMPL Factor Graphs

Referring again to FIG. 3, in some embodiments of the development system 1000, a factor graph model formed as the output of a software development module, in particular as the output of the DMPL module 1006, may be provides as input to a hardware synthesis and/or simulation component. As described fully in Section 3, in one embodiment, a FADL module 1010 is used as part of the process of simulating and/or fabricating factor graph hardware. For example, a DMPL FactorGraph object can be created in the software development environment and used to instantiate a FADL object as follows:

```
#Create the graph, bits, and function
setSolver(MinSumSolver( ))
factorGraph = FactorGraph( )
bits = [Bit( ),Bit( ),Bit( )]
f = factorGraph.addFunc(xorDelta,*bits)
################################################################
# Create the FADL object from the DMPL factor graph.
################################################################
fadl = FADL(factorGraph=factorGraph,priors=bits,beliefs=bits,\
    numIterations=numIterations,differential=differential)
```

3 FADL

The FADL module 1010, shown in FIG. 3, is an example of a software module that provides a way of taking an input specification for a factor graph, either directly from a user 1002, or as the output of a software development module, such as DMPL 1006, which is described above, and provides output that is used to drive a device fabrication process 1016, or a hardware simulation 2030.

A physical circuit that implements the factor graphs does not have nodes and edges. Instead, it has physical circuit elements, such as transistors, diodes, resistors, and capacitors. These elements occupy a semiconductor substrate with conducting traces providing pathways between one element and another. The process of actually building the physical circuit generally includes translating the factor graph into a pattern of circuit elements and connecting traces on a semiconductor substrate.

In an effort to reduce power consumption and area of the overall physical circuit, it is often preferable for certain circuit elements to implement more than one node on the factor graph. Because the same circuit elements are carrying out different functions at different cycles, it becomes necessary to provide switches and memory elements to orchestrate the activities of the circuit elements. The switches selectively switch circuit elements in and out of the circuit as the need arises, thus enabling it to change its role during operation of the network. The memory elements provide a place to temporarily hold values when the circuit element changes its role.

The existence of switches and memory elements, and the timing issues associated with determining how the switches should be set at any instant, creates a massive bookkeeping problem that greatly exacerbates the difficulty of translating a factor graph into a particular layout of hardware elements.

Figure 8:
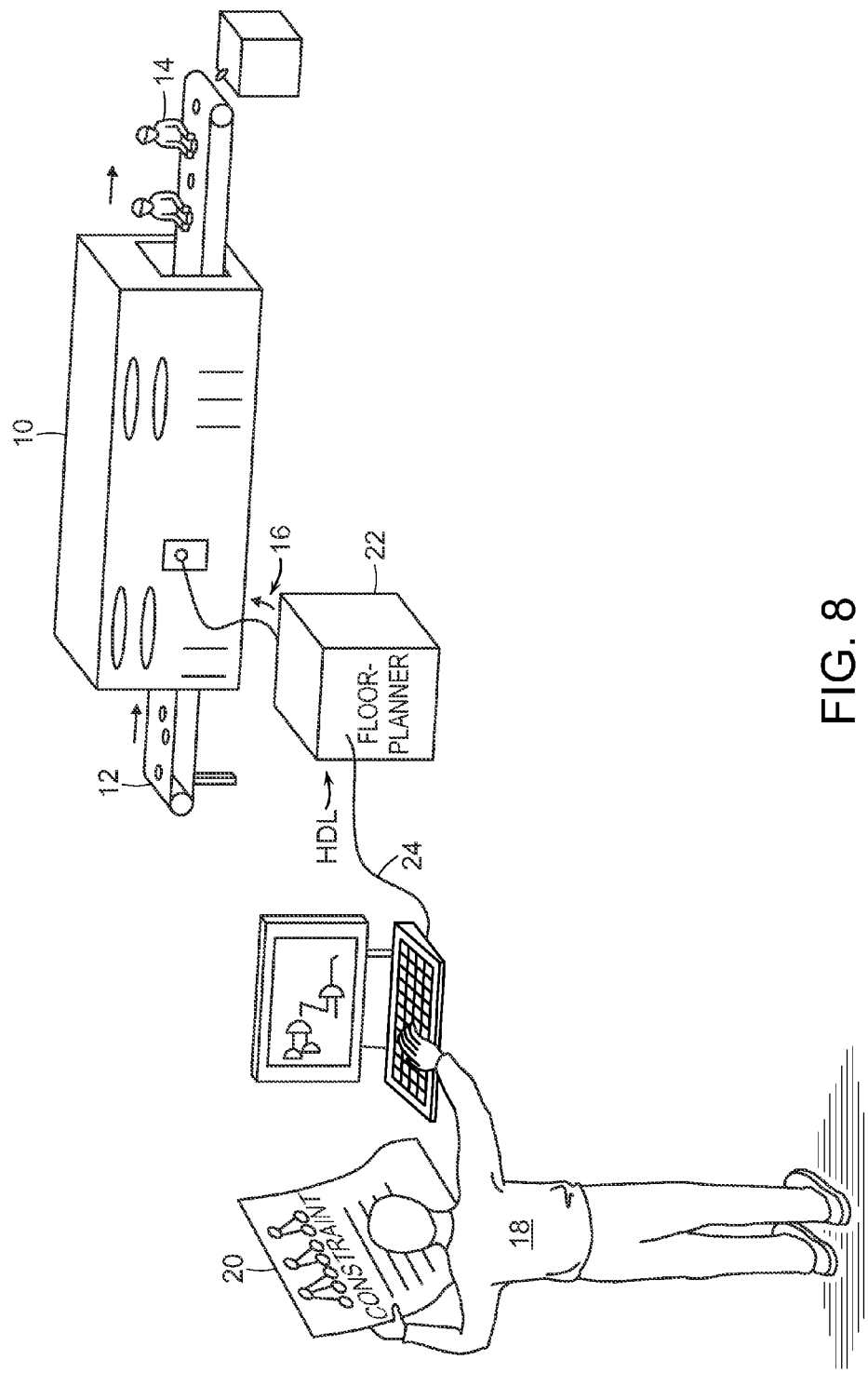
FIG. 8 shows a foundry for manufacture of articles such as ASICs having belief propagation networks embodied therein.

FIG. 8 shows a semiconductor foundry 10 for the manufacture of an ASIC (application specific integrated circuit) having a belief propagation network. The foundry 10 includes a semiconductor processing device that takes articles 12, such as semiconductor wafers, and transforms them into ASICs 14 having imprinted thereon circuitry for implementing a belief propagation network. The circuitry for implementing a belief propagation network includes transistors and diodes, as well as resistive and reactive (e.g. capacitors) linear circuit elements arranged to form digital and/or analog circuits.

To enable the foundry 10 to actually lay down circuit elements and connections on a semiconductor substrate, it is useful to provide the foundry 10 with information on where to place the circuit elements so that they cooperate in a satisfactory manner. The information on where to place circuit elements is provided to the foundry 10 by a hardware architect 18 who receives, from the factor-graph designer (not shown), an initial representation 20 of a belief propagation network. This initial representation specifies nodes and edges of a factor graph, together with any hardware constraints to be imposed on the belief propagation network.

Upon receiving the initial representation 20, the hardware architect 18 creates an HDL representation 24 of the factor graph and its associated constraints using a hardware descriptor language ("HDL") such as VERILOG. This HDL representation 24 would include empty nodes (i.e. nodes that do not necessarily specify any hardware within them, and can thus serve as placeholders), the interconnection between nodes, and the placement of switches and memory elements needed to enable circuit elements to serve more than one function. If necessary, the task of filling in the nodes, and thereby specifying what is in the nodes themselves, is carried out by the hardware architect 18. If the contents of the nodes already exist, then no further human intervention is needed.

This HDL representation 24 is in the form of VERILOG code. The resulting VERILOG code can then be provided to a hardware simulator 23, such as SPECTER, or used as a basis for fabricating an actual circuit on a semiconductor substrate at the foundry 10, as described below.

The task as described thus far involves two separate stages: (1) a first stage that results in creation of an initial representation of a factor graph, which would include a specification of nodes, edges, and constraints on what hardware is to be used for which nodes; and (2) a second stage in which the initial representation is used to create an HDL representation that includes details on what hardware elements are to be in the nodes. These two stages have been described as being carried out by two separate entities. In practice, nothing precludes a single entity or person from performing both.

The next step in the descent from the initial design of the factor graph into the manufacture of integrated circuits would be to provide the HDL representation 24 to a floor planner 22 for translation into a floor plan 16. This floor plan 16 would include details such as where on the substrate the physical circuit elements should go, what the paths of the wires connecting them should be, and what regions of the semiconductor substrate should be doped to actually form the various circuit elements.

Because the floor planner 22 is tied to a particular foundry 10, it is able to provide the floor plan to that particular foundry 10. The foundry 10 then uses this floor plan 16 as a basis for physically transforming tangible articles 12, such as semiconductor wafers, into a finished product 14. Thus, it can be said that the hardware architect 18, who generates the HDL representation 24 and the floor planner 22, which generates the floor plan 16, all participate in the transformation of the article 12.

Note that although the floor planner 22 could in principle be a fully automated device, in many cases, the floor planning process also requires the assistance of a human to perform some layout and routing of electronic structures.

The translation from an initial representation 20 of a belief propagation network to a corresponding HDL representation 24 is to some extent hampered by cognitive limitations of even the most skilled hardware architect 18. For large factor graphs with numerous constraints, the task can be painstaking and slow. Inevitably, errors arise in translation. These errors further delay transformation of the article 12.

Figure 9:
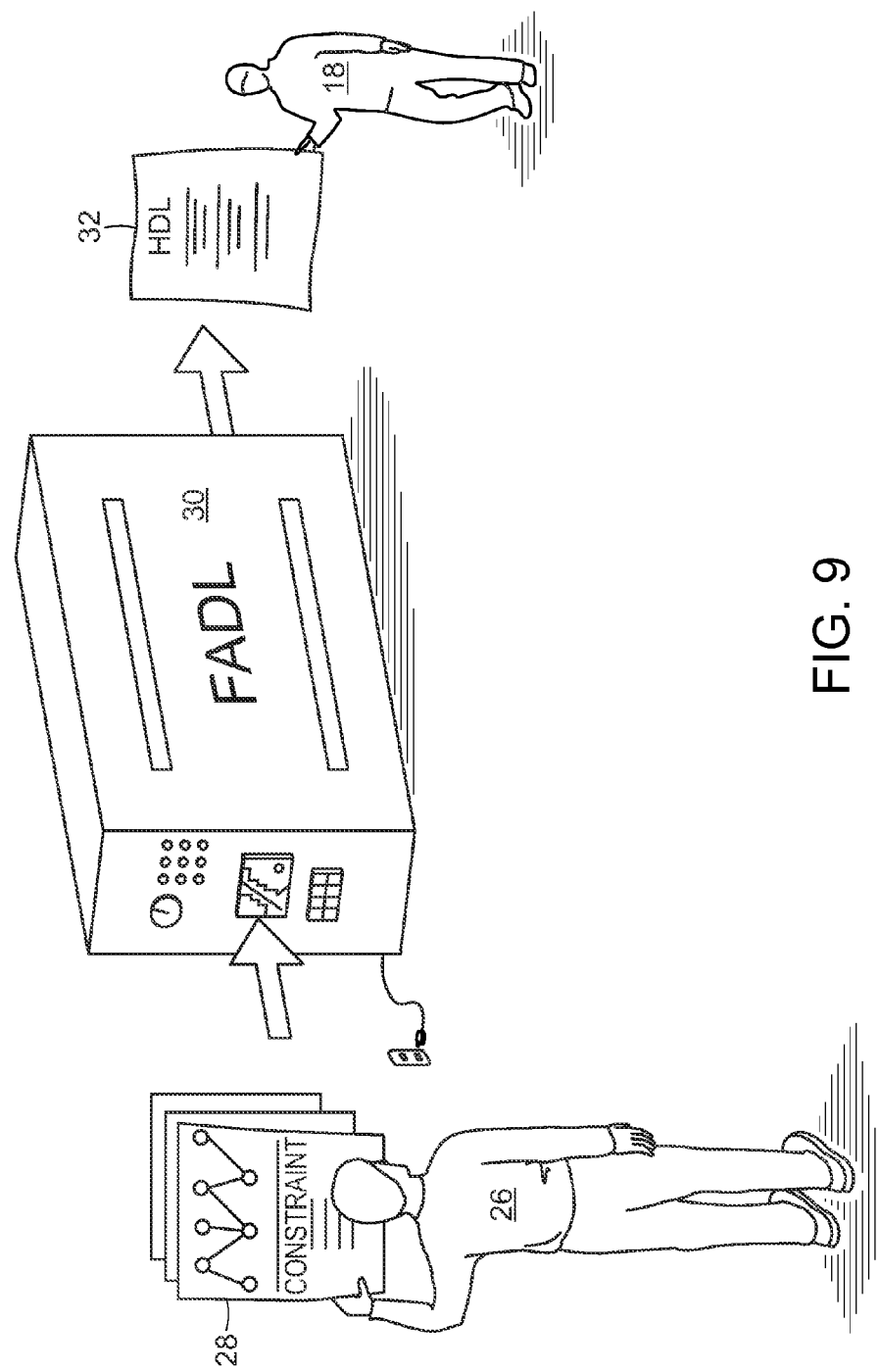
FIG. 9 shows the use of a FADL translator for generating an article encoding a physical design of a belief propagation network from an article encoding a logical design thereof.

In many cases, it is possible to exploit the properties of the factor graph itself to partially automate the process of translation from the initial representation 20 of a belief propagation network into an HDL representation 24. In such an implementation, shown in FIG. 9, a factor-graph designer 26 provides an initial representation 28 of the factor graph using a factor graph ASIC description language ("FADL"). A FADL translator 30 then carries out method steps, which are described in detail below, to translate this FADL representation 20 into an HDL representation 32 of the belief propagation network. In some embodiments, the FADL translator 30 is a compiler, whereas in others it is an interpreter.

The HDL representation 32 specifies the interconnections between nodes of the factor graph, as well as any switches or memory elements that are needed to comply with the constraints. It also includes nodes for receiving hardware that is to be specified by the hardware architect 18.

If the logic gates have already been made and the automatically HDL representation 32 is sufficient, the HDL representation 32 can be provided directly to the floor planner 22. Alternatively, the HDL representation 32 is provided to the hardware architect 18. As suggested above, the hardware architect 18 then writes HDL code for whatever is to fill the nodes. He then proceeds as described in connection with FIG. 8. In this way, the steps carried out by the FADL translator 30 assist the foundry 10 in transforming a tangible article 12 from a first state, in which it lacks an ASIC for implementing a belief propagation network, into a second state in which such an ASIC is present.

Because of the FADL translator 30, the hardware architect 18 no longer has to determine what switches and memory elements are needed, where they should be placed, and when they should be enabled to enforce the constraints set forth in the FADL representation 20. This difficult and error-prone task would already have been carried out by the FADL translator 30. Instead, the hardware architect 18 proceeds directly with specifying what hardware elements are to be placed in the nodes left empty by the FADL translator 30.

The following description sets forth an implementation of a FADL translator 30 for automatically transforming a FADL representation 20 of a belief propagation network into an HDL representation of that network. The particular implementation described herein makes use of the PYTHON programming language. Because factor graphs are represented internally as connectivity matrices, considerable use is made of PYTHON's NumPy extension for working with the large matrices. However, other programming environments, such as MATLAB, or a combination having MATLAB as a front end and Java or C++ as a back end, can also be used. Other implementations are summarized in Appendix 1 and Appendix 2, attached hereto.

Figures 10, 11:
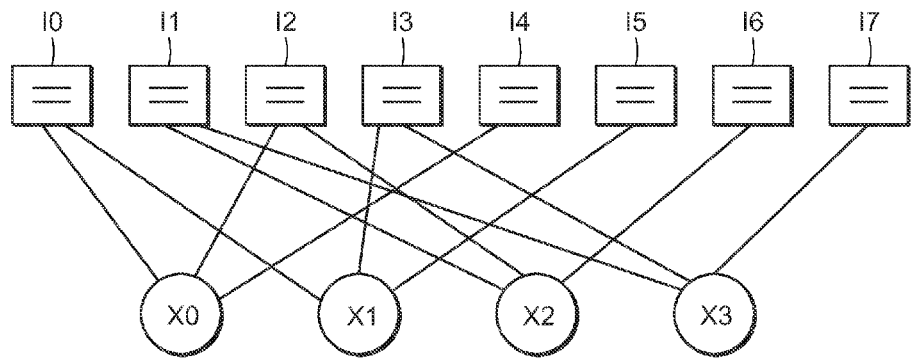
FIG. 10 shows a factor graph representative of a belief propagation network.
FIG. 11 shows a bi-adjacency matrix encoding hardware constraints on the factor graph of FIG. 10.

FIG. 10 shows an exemplary factor graph having eight variable nodes and four function nodes. A suitable representation of such a factor graph is:

$A = numpy.\text{array}([[1,0,1,0,1,0,0,0,],$ $\backslash[1,0,0,1,0,1,0,0], \backslash[0,1,1,0,0,0,1,0], \backslash[0,1,0,1,0,0,0,1]])$ In the above representation, each row corresponds to a function node and each column corresponds to a variable node. A "1" at the intersection of a particular row and column indicates the existence of an edge that connects the corresponding function node and variable node. Thus, the above matrix is often referred to as a "connectivity", or "biadjacency" matrix for the factor graph.

The function nodes and variable nodes referred to above will be referred to as "logical nodes." These logical nodes are distinct from the "physical nodes" that actually contain the circuitry for implementing the logical nodes. It is possible, with the judicious placement of switches and memory elements, for one physical node to carry out the function of several logical nodes. This time-sharing of physical nodes to play the role of multiple logical nodes reduces the circuit's overall footprint and power consumption.

In the example of FIG. 10, one constraint might be to require that whatever hardware is used to implement function node X0 also be used to implement function node X1, and that whatever hardware is used to implement function node X2 should also be used to implement function node X3. The resulting physical circuit would thus have hardware elements shared among four function nodes. Since the same circuitry can often be used to implement different functions, these functions can be different from each other.

In some cases, circuitry will need some reconfiguration to implement different function nodes. Thus, there may be embodiments in which the circuitry in a particular physical node is reconfigured whenever it is called upon to stop executing the function of a one logical node and begin executing the function of another logical node. In such cases, the physical node can have an additional input to enable a controller to specify the proper configuration of the circuitry within that node.

In some belief propagation networks, XOR processors implement function nodes and equals processors implement variable nodes. The following discussion assumes a belief propagation network of this type. However, the representations described below are general and do not require any particular implementation of a variable or function node. In general, a factor graph can have different types of function nodes.

The foregoing constraint on function nodes is represented as a list of sub-lists in which each of the sub-lists corresponds to a physical XOR, and in which the elements of a sub-list define the logical XORs implemented by a particular physical XOR. An example of such a constraint appears as follows:

physXors=[[0,1],[2,3]]

In the above expression, the first sub list "[0, 1]" corresponds to the first physical node. The elements 0 and 1 indicate that logical nodes 0 and 1 are to be implemented by circuitry contained in the first physical node. Similarly, the second sub list indicates that logical nodes 2 and 3 are to be implemented by circuitry in the second physical node. In some implementations, the logical nodes can be identified in the above expression by edges uniquely associated with those nodes.

Constraints in the number of equals-processors are also represented as a list of sub-lists. For example, a belief propagation network in which equals-nodes 4 and 5 and equals-nodes 6 and 7 share hardware and the remaining nodes have their own dedicated circuits could be represented by the following constraint, also in the form of a list of sub-lists:

physEquals=[[0],[1],[2],[3],[4,5],[6,7]]

FIG. 11 shows an adjacency matrix corresponding to the two constraints described above. A machine-readable representation of such a matrix is provided to the FADL translator 30 to be used in connection with generating the corresponding hardware description language representation 32. A physical realization of such an adjacency matrix has switches for enabling physical XOR 1 to switch between being connected to equals-nodes 3 and 4, and for enabling physical XOR 2 to switch between being connected to equals-nodes 3 and 4.

To determine the correct configuration of switches, the FADL translator 30 recognizes: that each row in FIG. 11 corresponds to a logical XOR node, that each column corresponds to a logical equals node, that the physical equals-processor used to implement a particular logical equals node is at the top of the column corresponding to that logical equals node, and that and that the physical XOR-processor for implementing a corresponding logical XOR node is listed in the right-most column of the matrix.

For example, according to FIG. 11, logical equals node 1 and 0 are both implemented by circuitry in physical equals node 5; logical equals node 4 is implemented by circuitry in physical equals node 4, and logical XOR nodes 1 and 2 are implemented by circuitry in physical XOR node 1.

Using the machine-readable representation of the adjacency matrix, the FADL translator 30 recognizes: that physical equals-processors 1 and 5 only need to connect to physical XOR-processor 1; that physical equals-processors 2 and 6 only need to connect to physical XOR-processor 2; and that physical equal processor 3 and 4 must be able to connect to both of the physical XOR-processors. Based on the foregoing observations, the FADL translator 30 specifies, in the HDL representation 32, that switches must be placed to selectively connect physical equals-processors 3 and 4 to either one of the two physical XOR-processors 1 and 2.

A suitable VERILOG description of the foregoing factor graph can include VERILOG modules corresponding to the two kinds of nodes present in the factor graph. These modules would be provided by the hardware architect 18 to specify the specific circuitry within those nodes. However, the FADL translator 30 would automatically generate the wires connecting the nodes and the switches for directing data flow in a manner consistent with both the hardware constraints and the logical design of the factor graph. For the factor graph shown in FIG. 10 subject to the above-mentioned hardware constraints, an abstraction of a resulting physical circuit appears as shown in FIG. 12.

Figure 12:
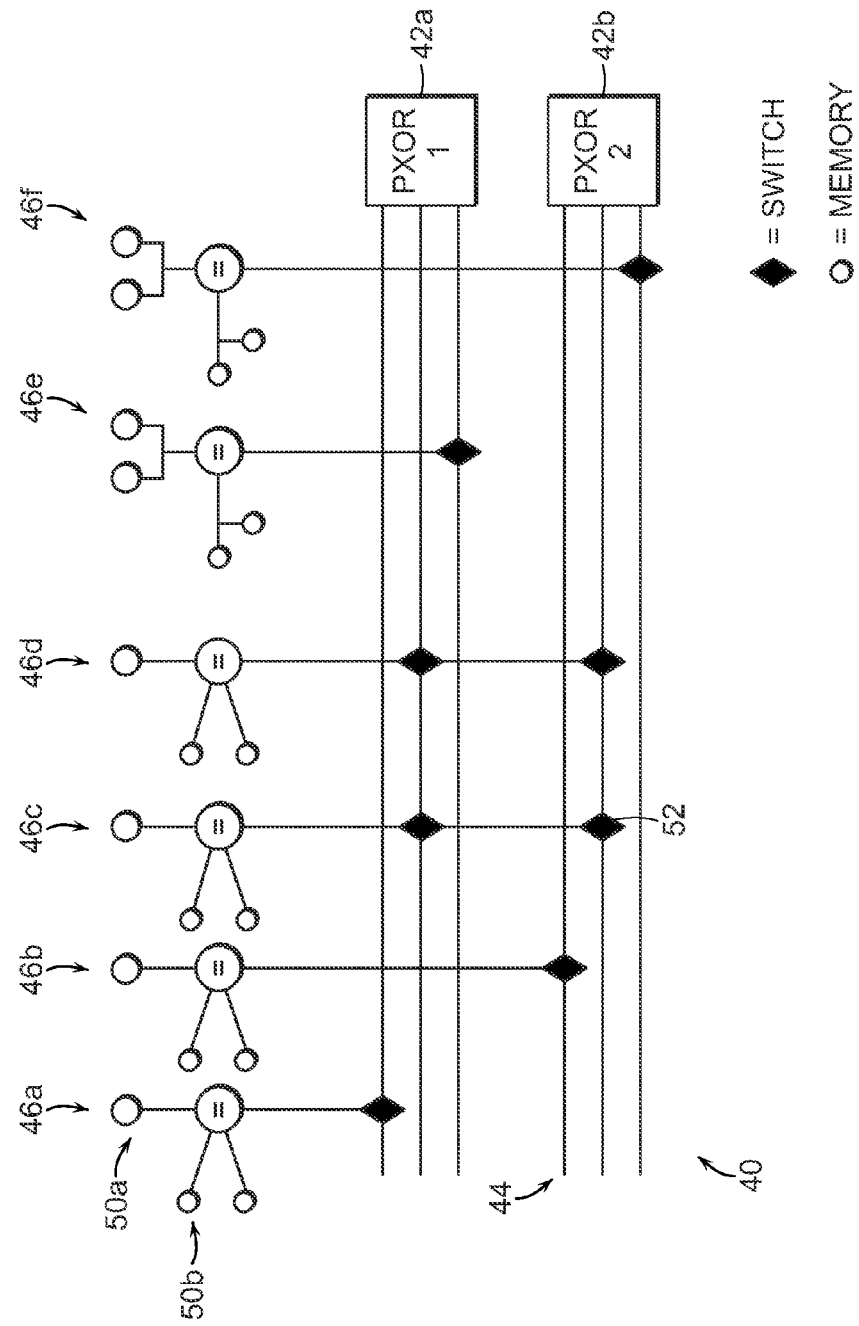
FIG. 12 shows a high level diagram of a physical circuit corresponding to the matrix in FIG. 11.

In FIG. 12, a physical circuit 40 for realizing the adjacency matrix in FIG. 11 includes two XOR-processors 42a, 42b, each of which has three inputs 44, and six equals-processors 46a-f. Some of the equals-processors 46a-b, 46e-f are connected to only one input of one of the XOR-processors. The remaining equals-processors 46c-d are connectable to either one of the XOR-processors by switches 48a-d.

Since a particular physical equals-processor may be shared by multiple logical equals-processors, it is useful to provide some sort of memory 50a-b for storing values to be used during a particular cycle of the belief propagation network. In the illustrated embodiment, these memories 50a-b are associated with the equals-processors. It is also useful to provide switches 52 so that a particular equals-processor can switch between memories, thereby enabling it to play the role of one logical equals-processor during one cycle and another logical equals-processor during another cycle. Alternatively, an output enable signal can be provided to whichever memory is to be used during a particular cycle. In general, an equals-processor needs one memory for each non-zero entry in the adjacency matrix of FIG. 11.

In addition to the adjacency matrix of FIG. 11, the factor-graph designer 26 also provides information specifying inputs and outputs at each cycle of the belief propagation network. In cases in which the belief propagation network includes multiple nodes that are realized by the same physical circuitry, there will often be multiple physical cycles required to implement one cycle of the belief propagation network. This arises because a particular physical circuit, although it can function as more than one node, cannot function as more than one node at the same time. These physical cycles will be referred to herein as "sub-cycles."

factor-graph designer 26 specifies inputs by providing a list of sub-lists. Each sub-list corresponds to the inputs to be provided at the beginning of a particular cycle. The entries of a sub-list corresponding to a particular cycle specify the equals-nodes that are to be provided with inputs at the beginning of that cycle. This results in the specification of which input memories are to be enabled at the beginning of each sub-cycle within that cycle so that data in those memories will be available during that sub-cycle.

Similarly, for specifying outputs, the factor-graph designer 26 provides another list of sub-lists, with the list having as many sub-lists as there are cycles. The elements of a sub-list corresponding to a particular cycle specify those outputs that are to be read at the beginning of that cycle.

Having defined the hardware configuration, the FADL translator 30 then generates sequencing information, which is stored in a ROM on the ASIC, where it is conveniently available for inspection by a finite state machine during operation of the belief propagation network. Such sequencing information includes information about which switches are closed and which memory elements are to be active when the machine is in a particular state. Alternatively, the sequencing information can be generated by hand when it is more efficient to do so.

The sequencing information to be written in ROM is generated by the FADL translator 30 on the basis of information provided by the factor-graph designer 26. In one practice, the factor-graph designer 26 provides the FADL translator 30 with a list of sub-lists. Each sub-list corresponding to a particular cycle. The number of sub-lists thus corresponds to the number of cycles. The elements of each sub-list specify the logical function nodes that are to be updated when the machine is in the cycle corresponding to that sub-list. For example, the following state specification:

updatelist((0,3),(1,2))

specifies that when the machine is in the first cycle, logical function nodes 0 and 3 are to be updated, and when the machine is in the second cycle, logical function nodes 1 and 2 are to be updated. It is unnecessary for the factor-graph designer 26 to specify physical function nodes because the FADL translator 30 recognizes how to translate from a logical node to a corresponding physical node. Using the adjacency matrix, the FADL translator 30 specifies, for each sub-cycle, the state of each switch, input enable, and output enable corresponding to that sub-cycle.

In an alternative practice, the factor-graph designer 26 provides a list of edges that are to be active during a particular sub-cycle. This implementation can likewise be carried out by having the factor-graph designer 26 provide a list of sub-lists, with each sub-list specifying those edges that are active during a particular sub-cycle.

Figure 13:
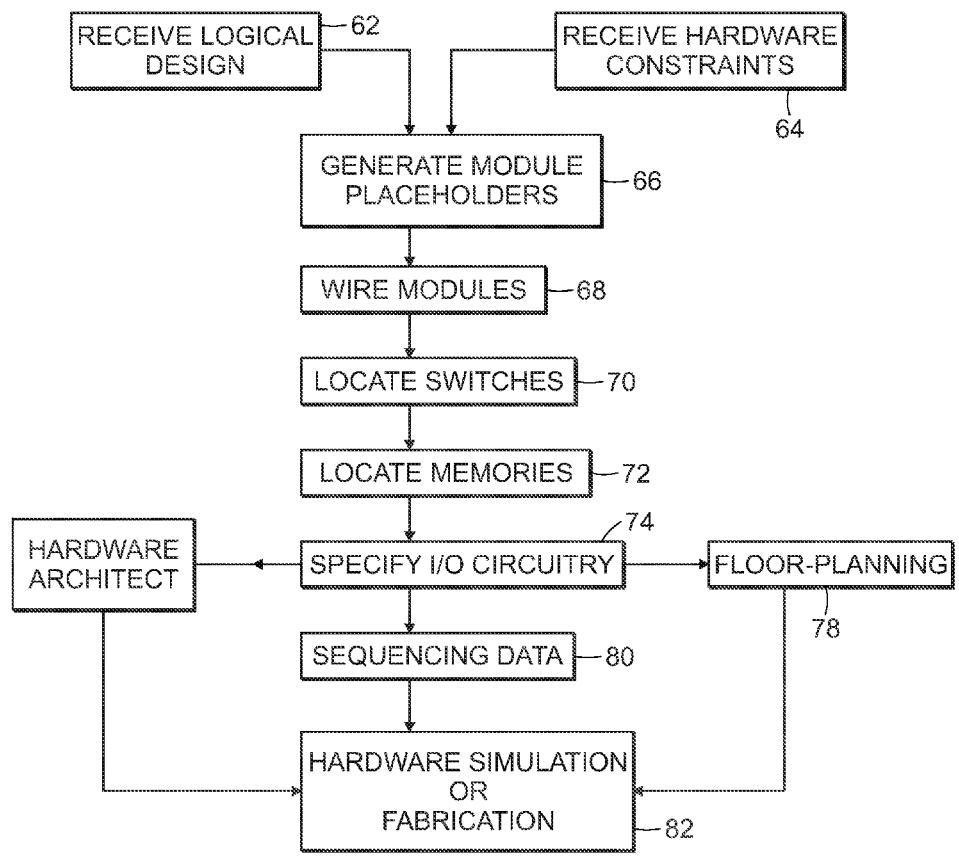
FIG. 13 is a flow chart of a procedure for generating an article encoding a physical design of a belief propagation network based on an article in which is encoded a logical design of the belief propagation network.

Referring now to FIG. 13, a method for operating a semiconductor foundry 10 or a hardware-simulator includes receiving a representation of a belief propagation network (steps 62). In response, empty nodes are generated. (step 66). The actual hardware to be placed into these empty nodes is specified in a later step.

Also generated is information concerning connections between the nodes (step 68), as well as information concerning placement of switches or memory elements required to satisfy the hardware constraints (step 70, 72), and input and output circuitry (step 74). Then, sequencing information governing the activities of the various circuit elements during operation of the belief propagation network is generated (step 80).

A partially-completed HDL representation of a belief propagation network's physical realization is then provided to the hardware architect, who specifies the hardware contained in the empty nodes (step 76). The now completed HDL representation is provided to a floor-planner (step 78), which generates a plan showing the layout of the actual semiconductor chip. This layout is then provided to the foundry (step 83) to be used in connection with fabrication of ASICs.

Alternatively, the completed HDL representation is provided to a hardware simulator for testing and debugging.

Figure 15:
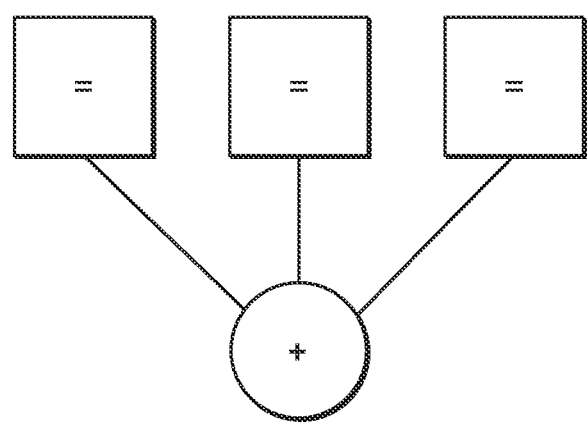
FIGS. 15 and 17 are factor graphs implemented by the example FADL representation shown in FIGS. 14 and 16 respectively.

FIG. 7 shows typical FADL representation 20 in PYTHON to be provided to the FADL translator 30 for generating an HDL representation of a 3-bit XOR as shown in FIG. 15.

The first two instructions 90 import the FADL module, which includes the "FADLgenVerilog" code for generating the VERILOG representation of the factor graph. The module "numpy" is a PYTHON module having numerous functions for matrix manipulation, one of which is used to represent a bi-adjacency matrix, as shown in matrix assignment 92. According to PYTHON syntax, [[1,1,1]] creates a list having a sub-list with three elements, all of which are 1's. The "np.array" function converts this into a two-dimensional numpy array. Matrices that are too large to conveniently include in code can also be read from an external file.

The next few instructions specify the hardware constraints and sequencing information.

The "edgeGroups" constraint 94 avoids needless memory allocation when many elements of the adjacency matrix are zero. The "edgeGroups" constraint 94 assigns all non-zero elements of the matrix to a single memory group. The argument "A.nonzero( )" is a function that returns a tuple of lists in which the first element contains the indices of the first dimension and the second element contains the indices of the second dimension. Calling "*" on a tuple unpacks it. The "zip" function takes two lists and returns a list of tuples. Thus, the "edgegroup" instruction 94 converts from the "nonzero( )" function output format to the "edgeGroup" input format.

As discussed earlier, the "physXors" constraint 96 is a list of sub-lists specifying which physical XORs serve as which logical XORs. This constraint makes it possible to avoid having a full parallel factor graph, which would consume considerable area and power.

In some cases, it is useful to group physical XORs into modules. The "xorGroups" constraint 98 allows such grouping to be carried out. The data structure expected by "xorGroups" is a list of sub-lists, with each sub-list representing an XOR group. The elements in each of the sub-lists are the physical XOR indices, i.e. the indices used to identify the physical XORs in the "physXors" list of sub-lists. The FADL FADL translator ensures that only one XOR group refers to a particular physical XOR.

The "bitMemGroups" constraint 100 specifies the memories that contain prior probabilities used as inputs when implementing belief propagation on a factor graph. Like the XORs, these memories are grouped into memory groups. The format for grouping these memories is another list of sub-lists. The FADL translator 30 ensures that each input memory is referred to by only one memory group.

The "updateGroups" constraint 102 is another list of sub-lists in which each list represents a state in a sequence of states. The elements of each sub-list specify the XORs that are to be updated concurrently. The FADL translator 30 ensures that each constraint is referred to only once in a particular state, and that no physical XOR updates two constraints at the same time.

The "directory" assignment 104 specifies the directory into which VERILOG files generated by the translator 30 are to be placed.

The next step is to assign existing VERILOG files to certain nodes. This step arises because the FADL translator describes connectivity between nodes, but not what is in the actual nodes. Although any node can be implemented by specifying appropriate hardware, the most useful ones for belief propagation networks are those listed in the "customModules" assignment 106. These are "Xor2x1," which performs an XOR operation, "MemCell," which stores a value associated with an edge of the factor graph, "Cntrl," which schedules memory enable instructions, and "FactorGraphTestBench," which reads data from files, loads the "FactorGraph" module, and saves results to other files. The FADL translator 30 provides default versions of these modules for convenience in specifying the contents of each node. However, new ones can be provided on an as-needed basis.

In many instances, the HDL representation 24 is used as a basis for simulation of the factor graph in operation. The FADL translator 30 automatically generates a run script for running a simulation. The "additionalModules" instruction 108 provides a way to enter strings to be used in generating this run script. The strings listed in the example of FIG. 14 are referred to by a default "cntrl" module specified in the "customModules" assignment 106.

The next few instructions specify parameters to be used during the simulation. The value of "numIterations" 110 controls how long the simulation will last, and the value of "debug" 112 controls whether or not intermediate data generated during the simulation is saved.

The last instruction generates VERILOG code using values that have been specified earlier. The resulting VERILOG code is saved in the specified directory and available for use by a hardware simulator 23 or for transmission to a floor planner 22.

Figure 17:
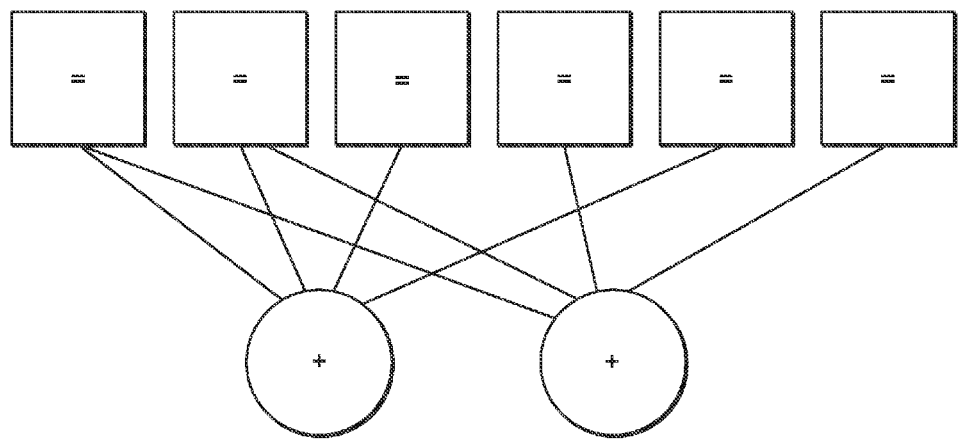
Figure 18:
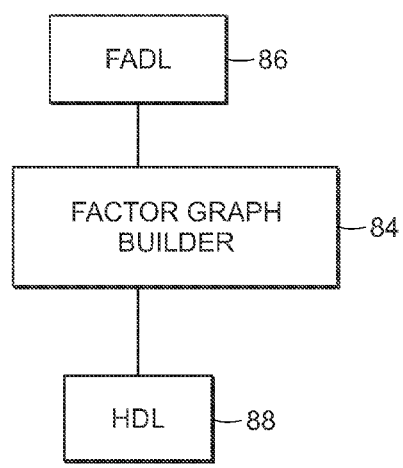
FIG. 18 shows an object-oriented programming environment for implementing a FADL translator.

FIG. 16 shows a more complex example in which a FADL representation 20 provided to the FADL translator 30 represents the factor graph shown in FIG. 17. The resulting FADL representation 20 is similar to that shown in FIG. 14, with the exception of a larger number of iterations, and in the specification of the adjacency matrix, "physXors", "bitMemGroups" and "updateGroups."

Figure 19:
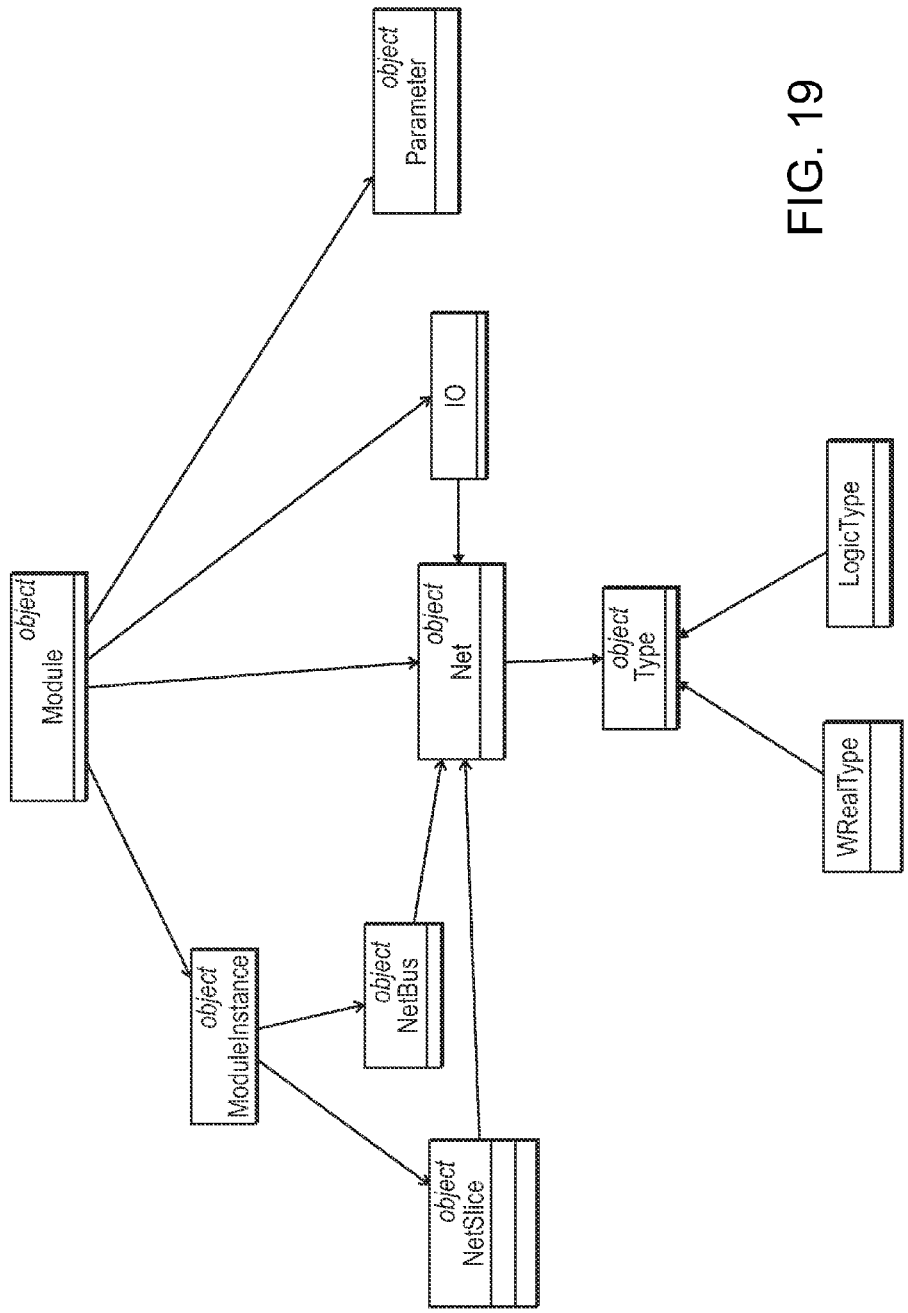
FIG. 19 shows classes and class relationships when the HDL representation of FIG. 18 is a VERILOG representation.

The FADL translator 30 is implemented in an object-oriented programming environment, shown in FIG. 11, by defining classes for each of the factor graph modules (e.g. switches, XORs, XOR groups, memory groups, and memory cells). These classes are collected in a factor graph builder module 84. A FADL module 86 includes functions for instantiating objects defined by the various classes available in the factor graph builder module 84. An HDL module 88 includes classes that are specific to a particular HDL. By swapping different HDL modules in and out, one can use the same FADL module 86 and factor graph builder module 84 to generate hardware representations in different hardware descriptor languages, including VERILOG, SPICE, and Java, among others. In the particular embodiment in which the HDL module 88 is a VERILOG module, the classes and their relationships are as shown in FIG. 19.

Figure 20:
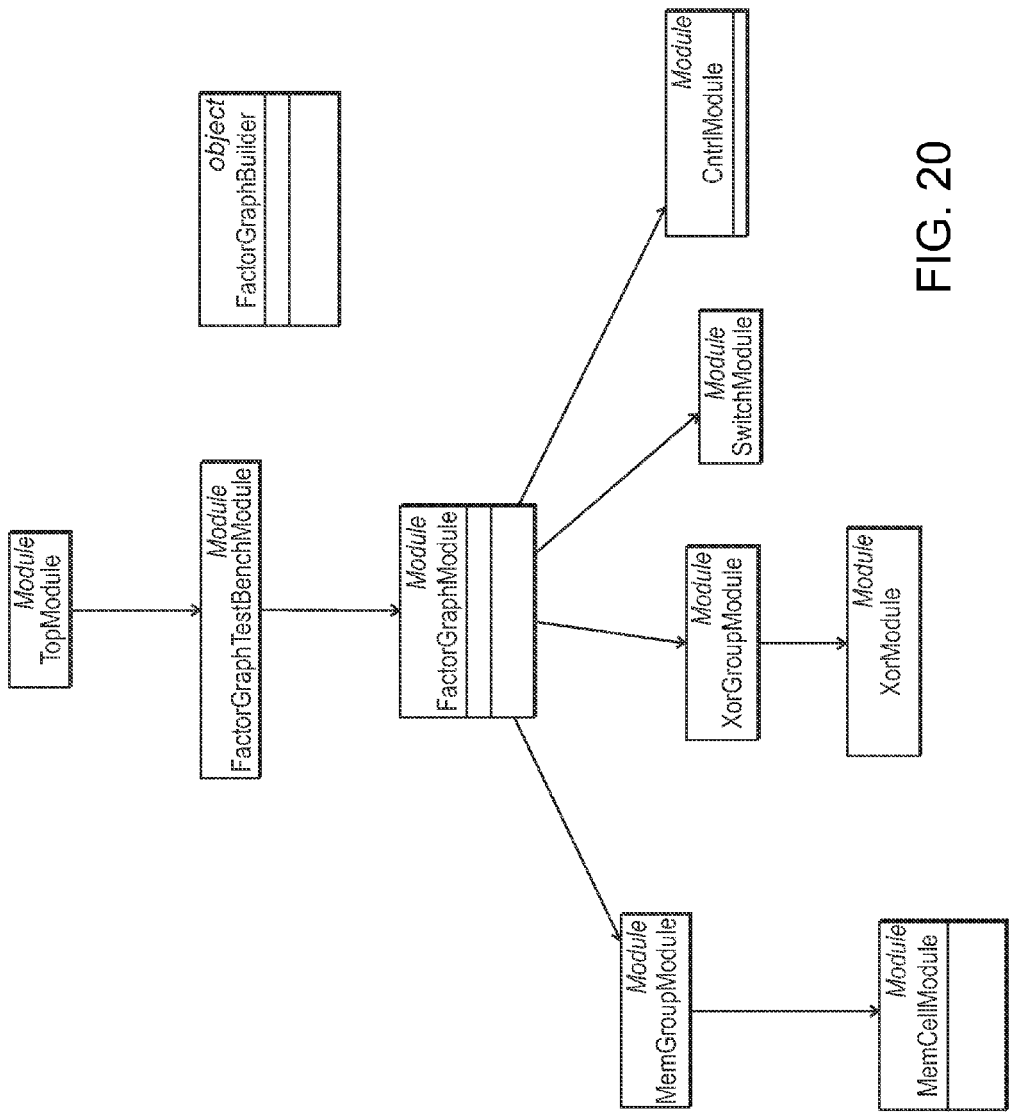
FIG. 20 shows classes and class relationships for the factor graph builder in FIG. 18.

FIG. 20 shows the classes and their relationships in the factor graph builder module 84. Each class that has a "module" suffix inherits properties from a corresponding class in the HDL module 88. The class "FactorGraphBuilder" shown in FIG. 20 is the class that creates the factor graph module.

4 Implementations

It should be understood that in some examples, modules, for instance the modules shown in FIG. 3, are implemented in software, with instructions stored on tangible computer-readable media being used to cause one or more data processing systems to implement and operate components as described above. In some examples, modules may be implemented, at least in part, using hardware, which may accelerate their execution speed. Users may provide their input through a variety of interfaces, including graphical user interfaces (GUIs), which provide output, such as representations of the factor graphs or their specifications or outputs of execution of the developed factor graphs.

As introduced above, different embodiments of development systems can include subsets of the features and capabilities described above. In particular, it should be noted that the DMPL and FADL components have utility one their own, as well as in combination.

What is claimed is:

1. A computer-implemented method for generating a hardware description of a belief propagation network, said method comprising:
   receiving an initial representation of a belief propagation network representing a graphical model for performing inference having a factor graph that includes a first class of nodes representing variables and a second class of nodes representing constraints between variables, the nodes being connected by edges;
   receiving a specification indicating that that a hardware element is to be used to implement at least two nodes of said factor graph;
   generating empty nodes for receiving information representative of hardware modules each having one or more hardware elements for physically implementing said nodes; and
   on the basis of said initial representation and said specification, generating, by using a computer, a hardware representation of an electronic circuit for implementing said factor graph.

2. The method of claim 1, wherein generating a hardware representation comprises generating a hardware descriptor language representation of said specification.

3. The method of claim 1, wherein generating a hardware representation comprises generating a VERILOG representation of said specification.

4. The method of claim 1, further comprising receiving a specification of hardware to be placed in said nodes.

5. The method of claim 1, wherein receiving said specification comprises receiving a specification of function nodes to be implemented by a particular XOR-processor.

6. The method of claim 1, wherein receiving said specification comprises receiving a specification of variable nodes to be implemented by a particular equals-processor.

7. The method of claim 1, further comprising specifying additional hardware elements to enable said hardware element to realize at least two nodes of said factor graph.

8. The method of claim 7, wherein specifying additional hardware elements comprises specifying at least one switch.

9. The method of claim 7, wherein specifying additional hardware elements comprises specifying at least one memory element.

10. The method of claim 1, further comprising providing said hardware representation to a hardware simulator for simulation of said belief propagation network.

11. The method of claim 1, further comprising providing said hardware representation to a floor planner for generating a floor plan of an integrated circuit for implementing said belief propagation network.

12. A non-transitory machine readable medium having instructions encoded thereon, said instructions, when executed by a data processing system, cause the system to
- receive an initial representation of a belief propagation network representing a graphical model for performing inference having a factor graph that includes a first class of nodes representing variables and a second class of nodes representing constraints between variables, the nodes being connected by edges;
- receive a specification indicating that that a hardware element is to be used to implement at least two nodes of said factor graph;
- generate empty nodes for receiving information representative of hardware modules each having one or more hardware elements for physically implementing said nodes; and
- on the basis of said initial representation and said specification, generate a hardware representation of an electronic circuit for implementing said factor graph.

13. The non-transitory machine readable medium of claim 12, wherein said instructions, when executed by the data processing system, further cause the system to generate a hardware representation comprise instructions for causing said data processing system to generate a hardware descriptor language representation of said specification.

14. The non-transitory machine readable medium of claim 1, wherein said instructions, when executed by the data processing system, cause the system to generate a VERILOG representation of said specification.

15. The non-transitory machine readable medium of claim 12, wherein said instructions, when executed by the data processing system, further cause the system to receive a specification of hardware to be placed in said nodes.

16. The non-transitory machine readable medium of claim 12, wherein said instructions, when executed by the data processing system, cause the system to receive said specification comprise instructions for receiving a specification of function nodes to be implemented by a particular XOR-processor.

17. The non-transitory machine readable medium of claim 12, wherein said instructions, when executed by the data processing system, cause the system to receive a specification of variable nodes to be implemented by a particular equals-processor.

18. The non-transitory machine readable medium of claim 12, wherein said instructions, when executed by the data processing system, cause the system to specify additional hardware elements to enable said hardware element to realize at least two nodes of said factor graph.

19. The non-transitory machine readable medium of claim 18, wherein said instructions, when executed by the data processing system, cause the system to specify at least one switch.

20. The non-transitory machine readable medium of claim 18, wherein said instructions, when executed by the data processing system, cause the system to specify at least one memory element.

21. The non-transitory machine readable medium of claim 12, wherein said instructions, when executed by the data processing system, cause the system to provide said hardware representation to a hardware simulator for simulation of said belief propagation network.

22. The non-transitory machine readable medium of claim 12, wherein said instructions, when executed by the data processing system, cause the system to provide said hardware representation to a floor planner for generating a floor plan of an integrated circuit for implementing said belief propagation network.

\* \* \* \* \*